(12) United States Patent
Roth et al.

(10) Patent No.: US 9,196,560 B2
(45) Date of Patent: Nov. 24, 2015

(54) SEMICONDUCTOR DEVICE HAVING A LOCALLY REINFORCED METALLIZATION STRUCTURE AND METHOD FOR MANUFACTURING THEREOF

(71) Applicant: Infineon Technologies Austria AG, Villach (AT)

(72) Inventors: Roman Roth, Sattendorf (AT); Frank Umbach, Munich (DE)

(73) Assignee: Infineon Technologies Austria AG, Villach (AT)

( * ) Notice: Subject to any disclaimer, the term of this patent is extended or adjusted under 35 U.S.C. 154(b) by 54 days.

(21) Appl. No.: 14/068,374

(22) Filed: Oct. 31, 2013

(65) Prior Publication Data

US 2015/0115391 A1 Apr. 30, 2015

(51) Int. Cl.
| | |
|---|---|
| H01L 21/44 | (2006.01) |
| H01L 23/367 | (2006.01) |
| H01L 21/283 | (2006.01) |
| H01L 29/861 | (2006.01) |
| H01L 29/06 | (2006.01) |
| H01L 29/40 | (2006.01) |

(52) U.S. Cl.
CPC ............ *H01L 23/367* (2013.01); *H01L 21/283* (2013.01); *H01L 29/8611* (2013.01); *H01L 29/0619* (2013.01); *H01L 29/404* (2013.01)

(58) Field of Classification Search
CPC . H01L 21/043; H01L 21/0465; H01L 21/045; H01L 21/02126; H01L 21/041; H01L 21/28079; H01L 21/31683; H01L 21/845; H01L 21/67063; H01L 21/67069; H01L 21/31658; H01L 27/1104; H01L 27/3248; H01L 27/098; H01L 29/435; H01L 29/66045; H01L 29/6603
USPC ......... 438/597, 583, 687, 678, 602, 603, 604, 438/706, 745, 736; 257/E21.006, E21.027, 257/E21.051, E21.953, E21.054, E21.058, 257/E21.062, E21.097, E21.098, E21.102, 257/E21.115, E21.126, E21.127, E21.129, 257/E21.17, E21.182, E21.216, E21.231, 257/E21.229, E21.245, E21.256, E21.257, 257/E21.352, E21.421, E21.485, E21.53
See application file for complete search history.

(56) References Cited

U.S. PATENT DOCUMENTS

| | | | | |
|---|---|---|---|---|
| 5,156,998 | A * | 10/1992 | Chi et al. | 438/121 |
| 5,640,067 | A * | 6/1997 | Yamauchi et al. | 313/504 |
| 6,559,023 | B2 * | 5/2003 | Otsuki et al. | 438/342 |
| 7,276,764 | B1 * | 10/2007 | Sakamoto | 257/329 |
| 8,008,712 | B2 * | 8/2011 | Hille et al. | 257/329 |

* cited by examiner

*Primary Examiner* — David Nhu
(74) *Attorney, Agent, or Firm* — Murphy, Bilak & Homiller, PLLC

(57) ABSTRACT

A method for forming a semiconductor device includes providing a semiconductor substrate having a first area and a second area. A first metal layer structure is formed which includes at least a first metal portion in the first area and a second metal portion in the second area. A plating mask is formed on the first metal layer structure to cover the second metal portion, and a second metal layer structure is plated on and in ohmic contact with the first metal portion of the first metal layer structure.

14 Claims, 19 Drawing Sheets

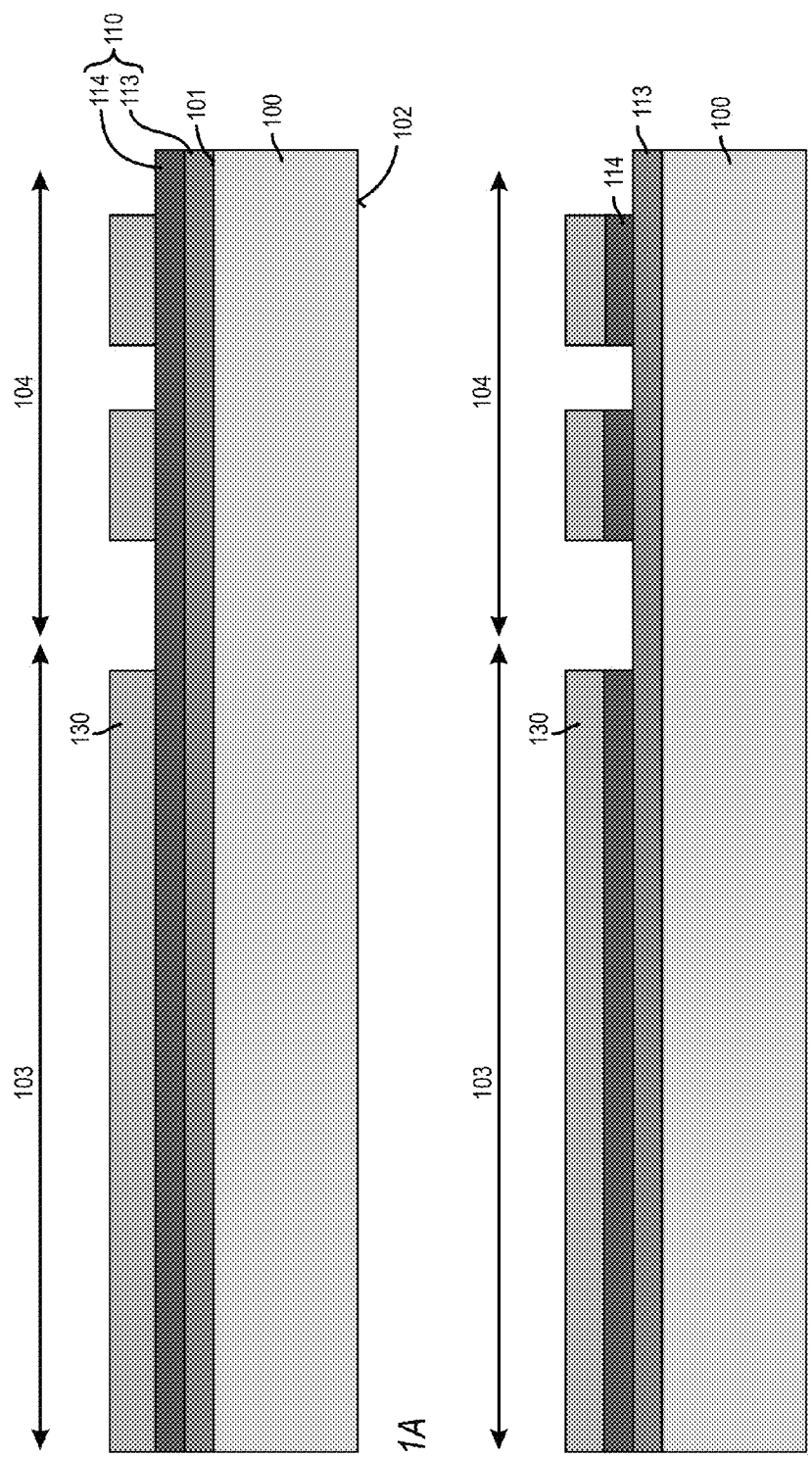

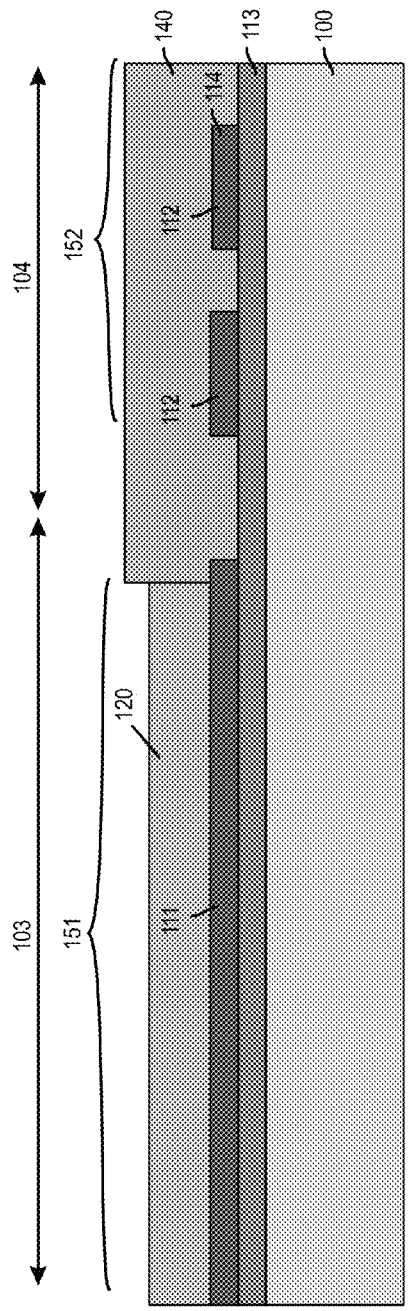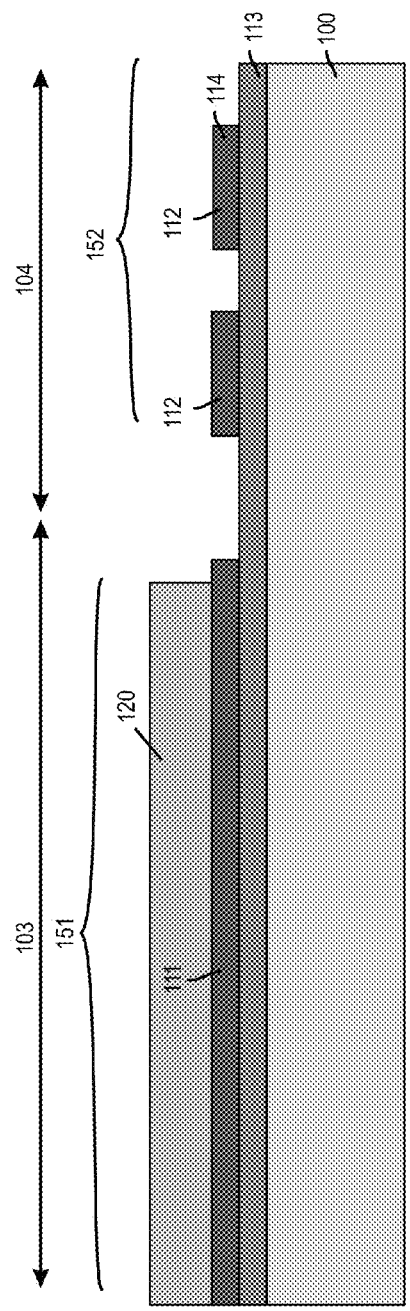

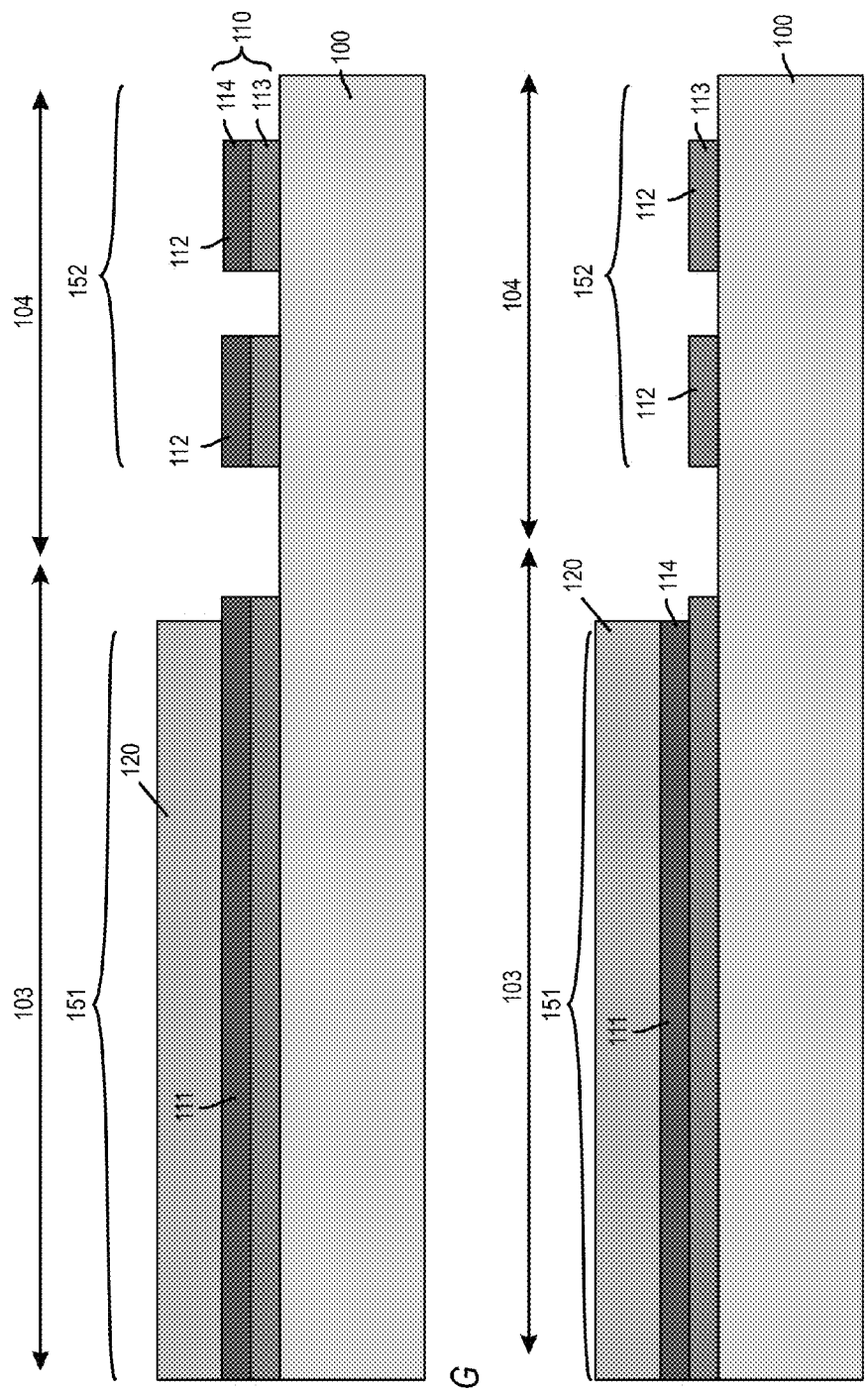

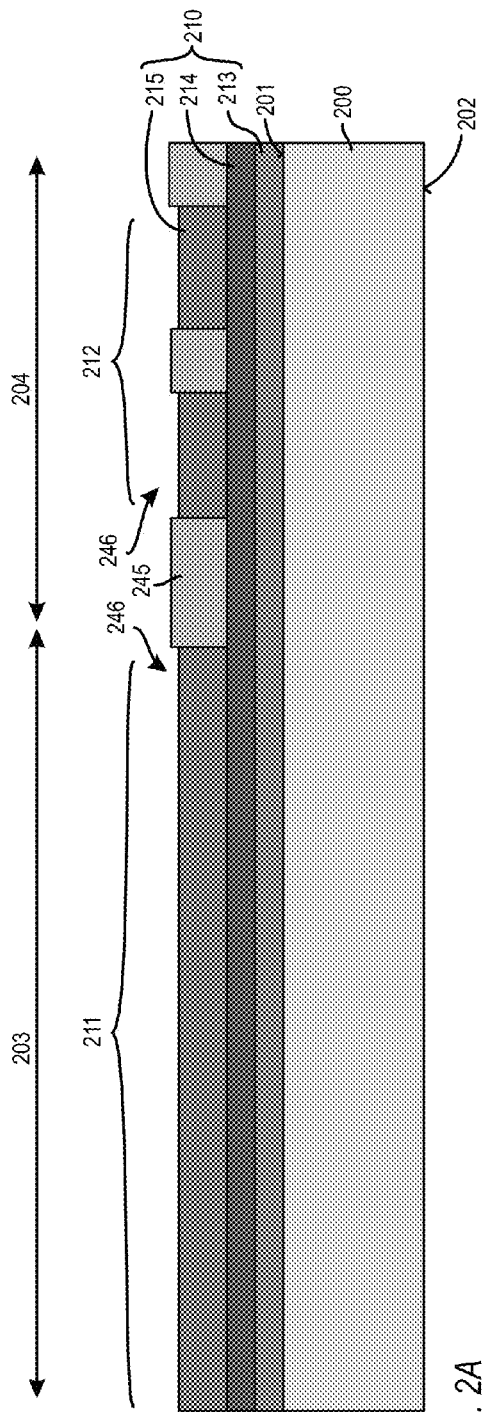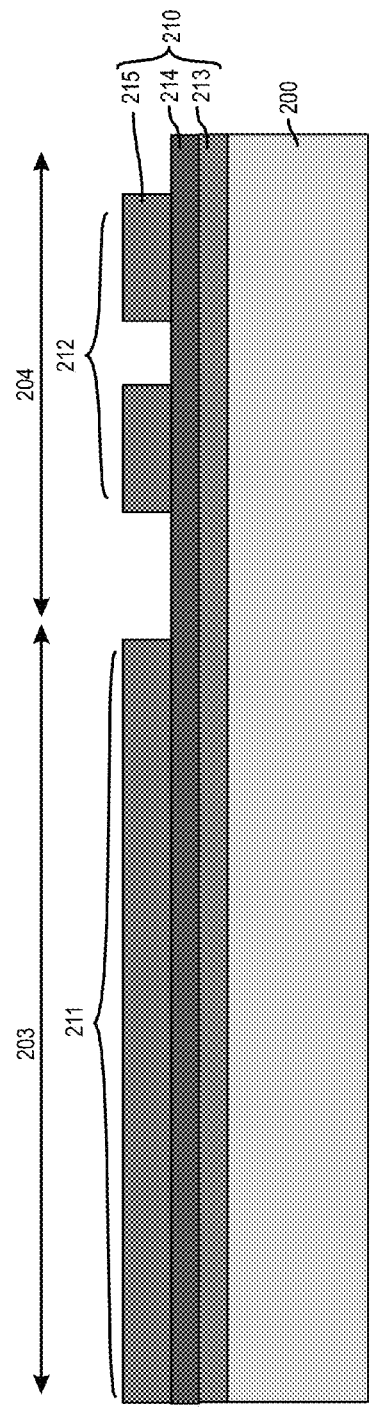

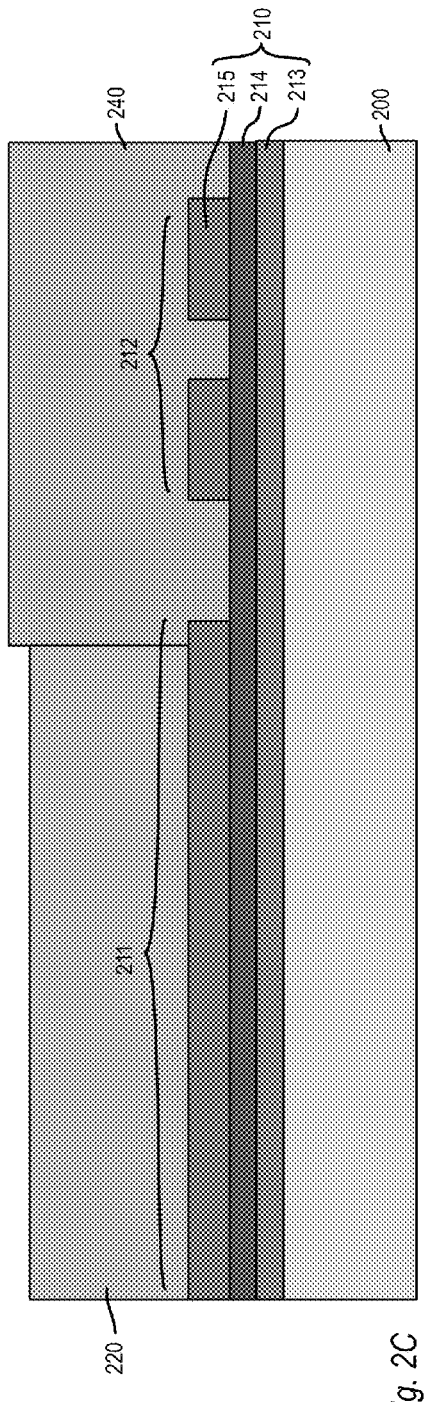
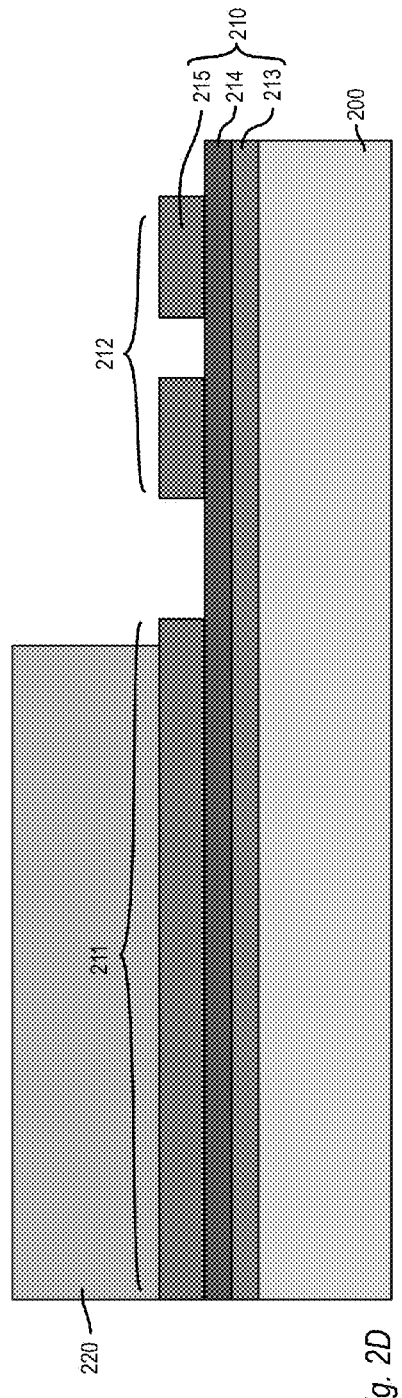
Fig. 2C
Fig. 2D

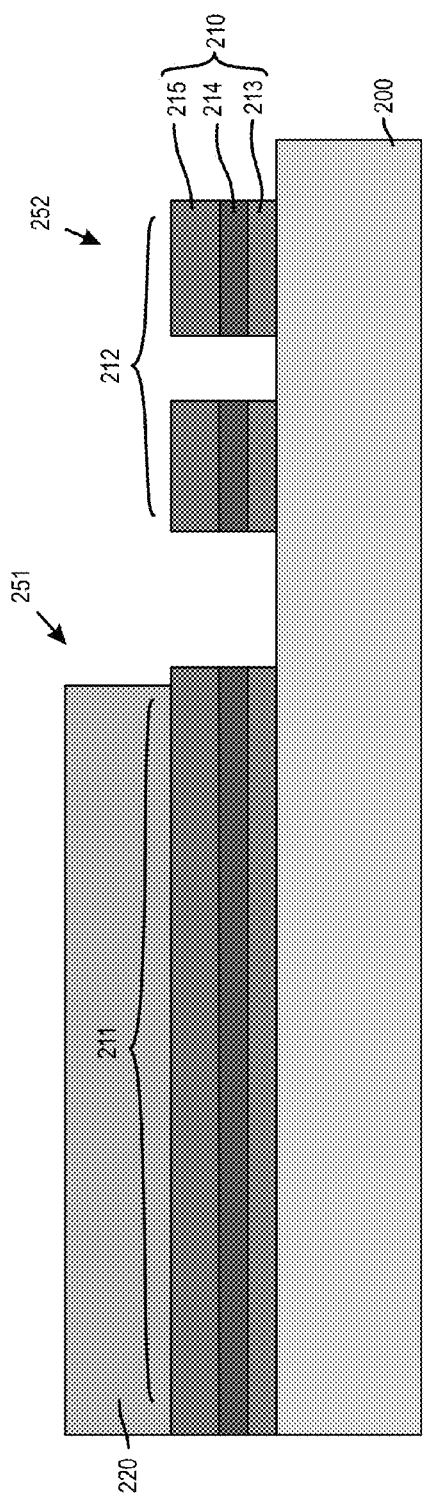
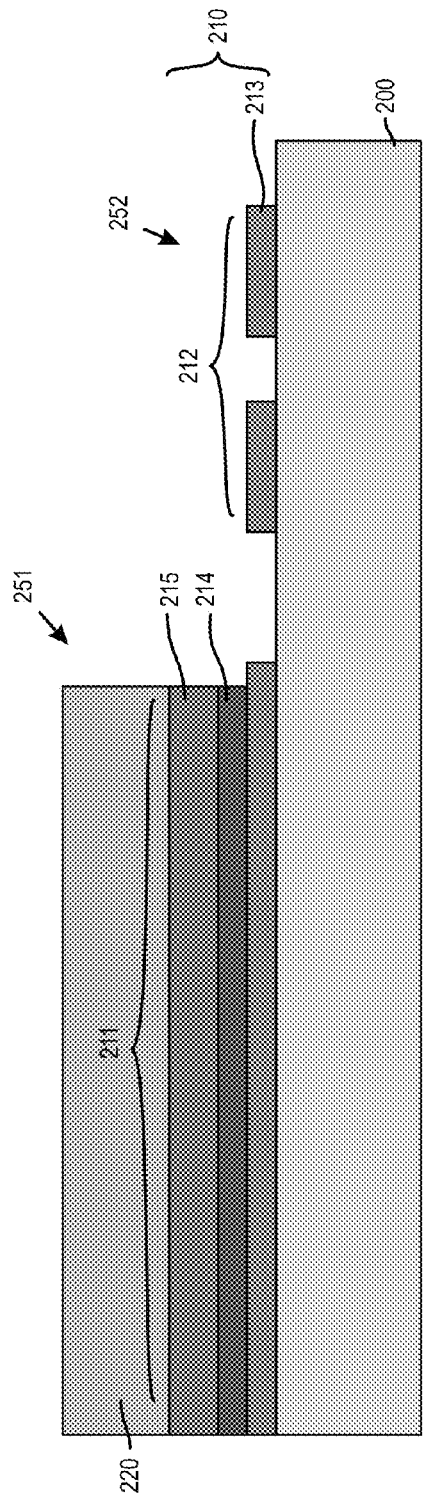
Fig. 2E
Fig. 2F

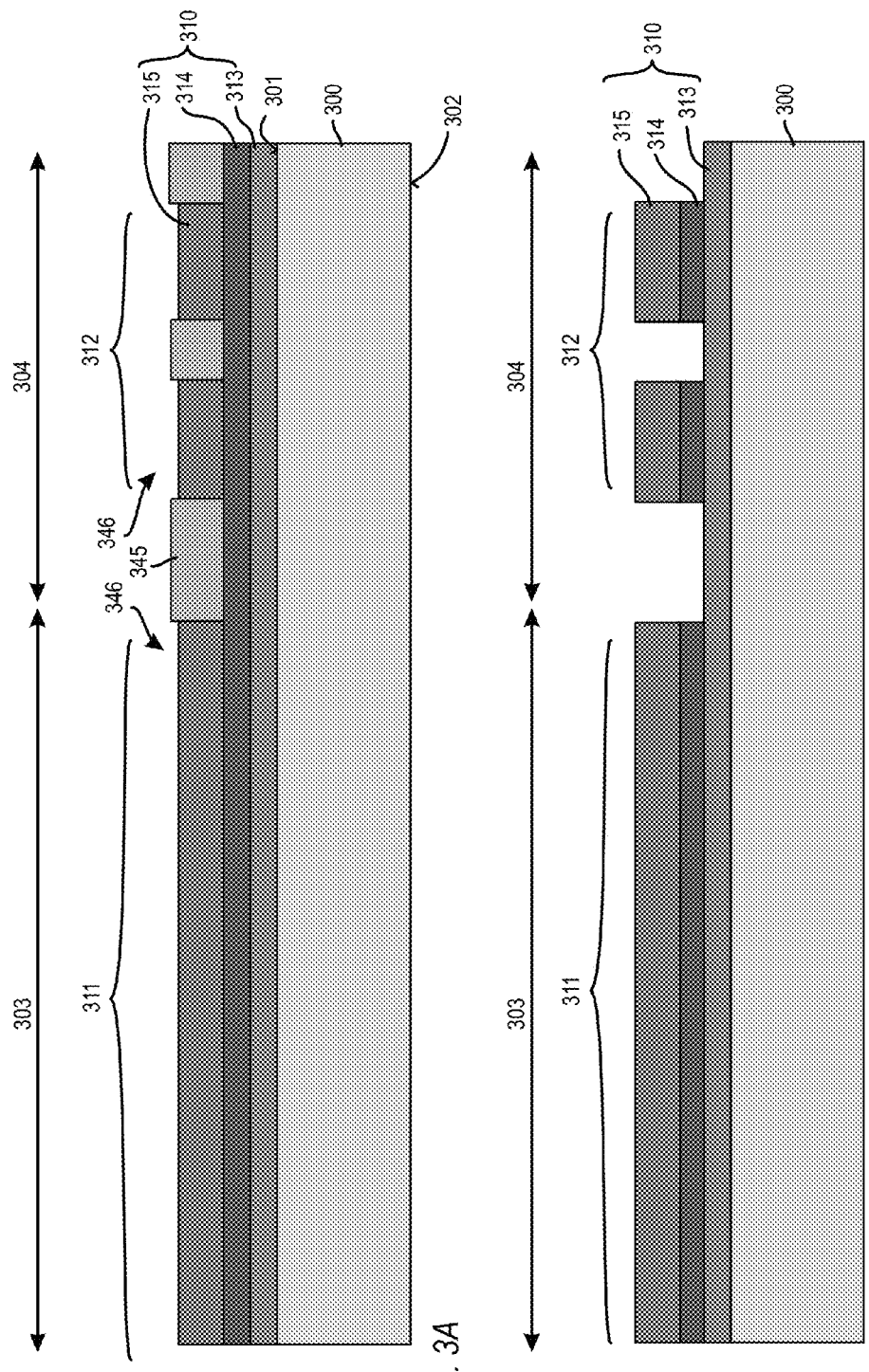

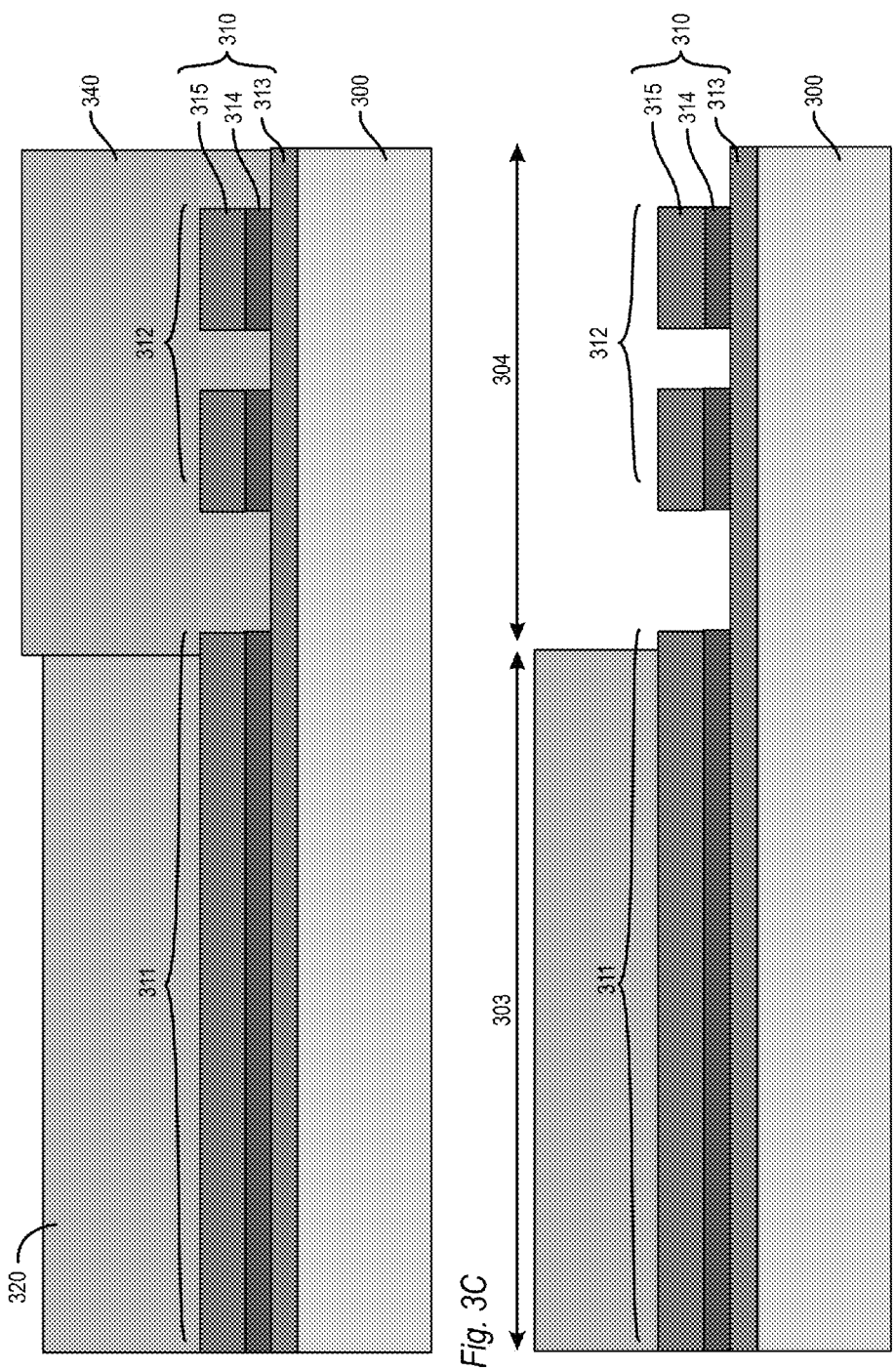

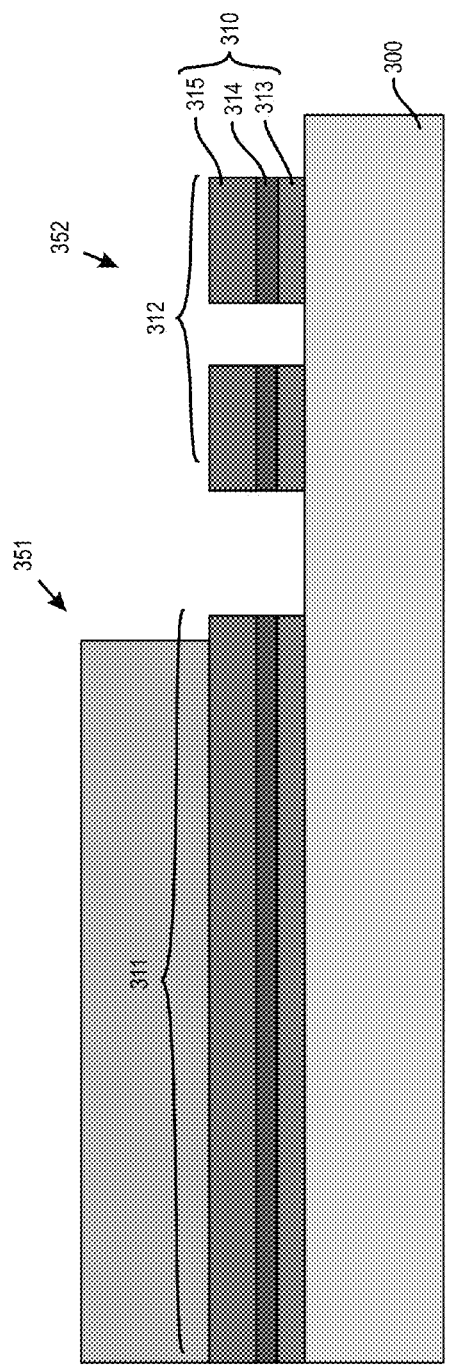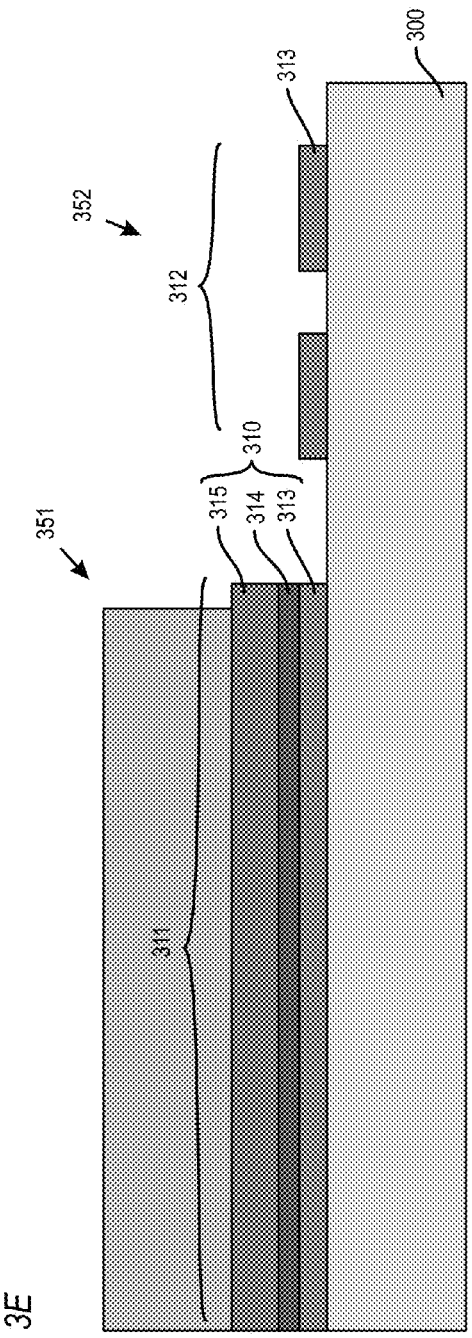

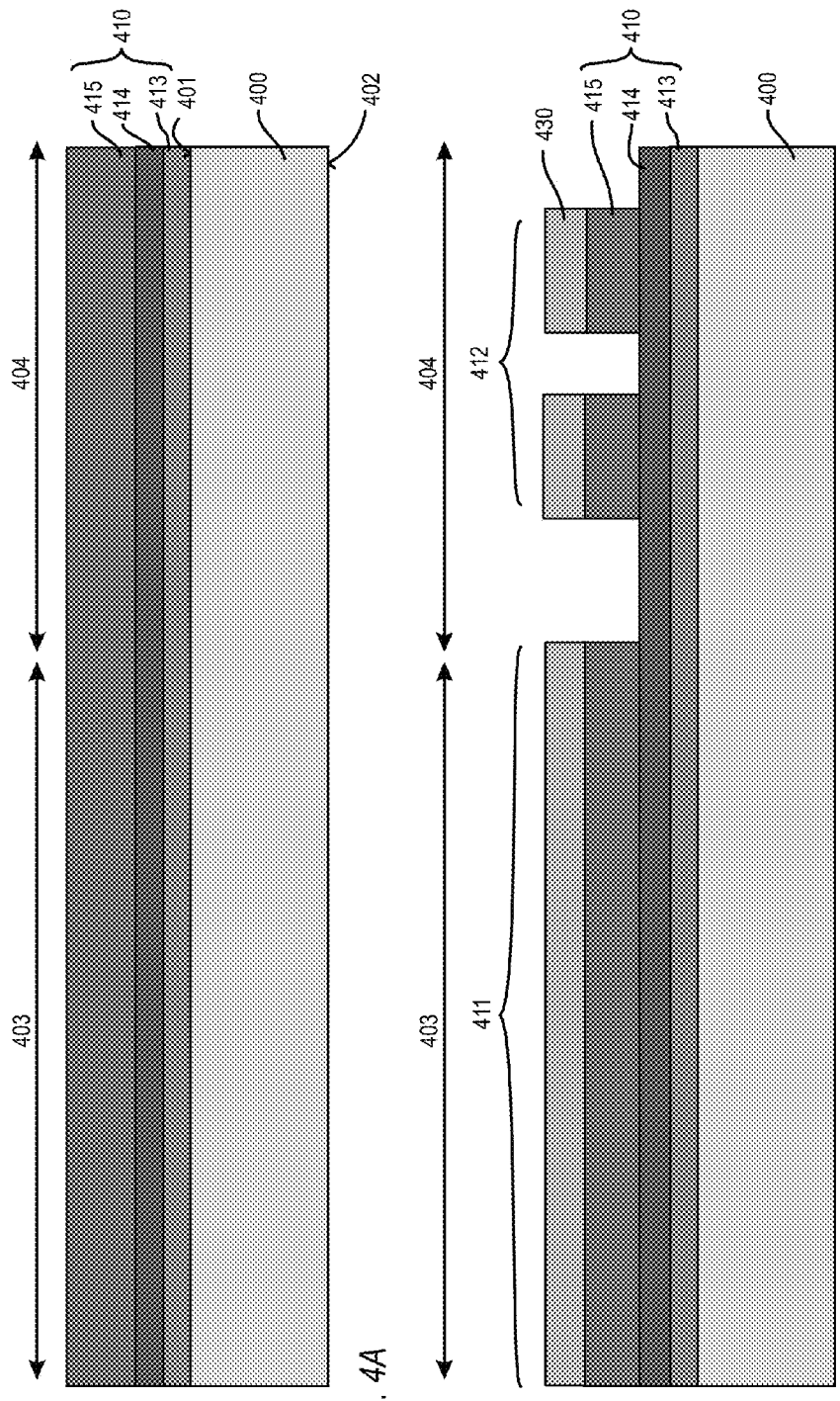

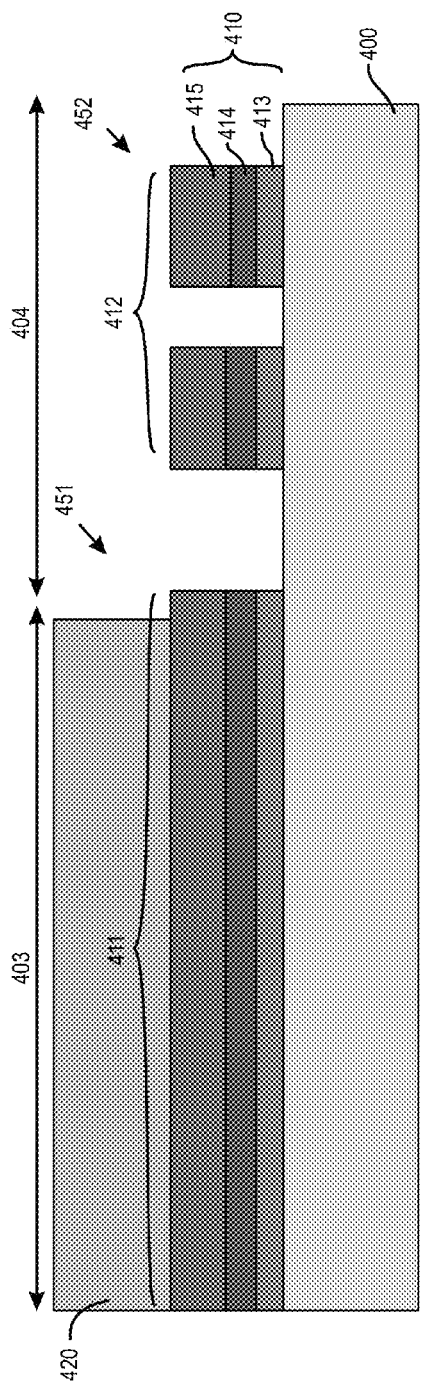
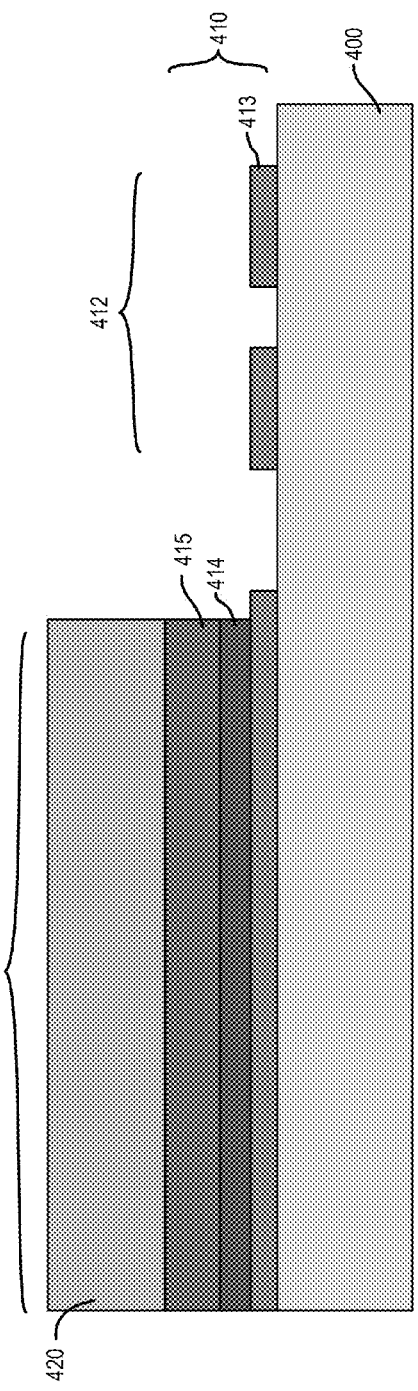
Fig. 4D
Fig. 4E

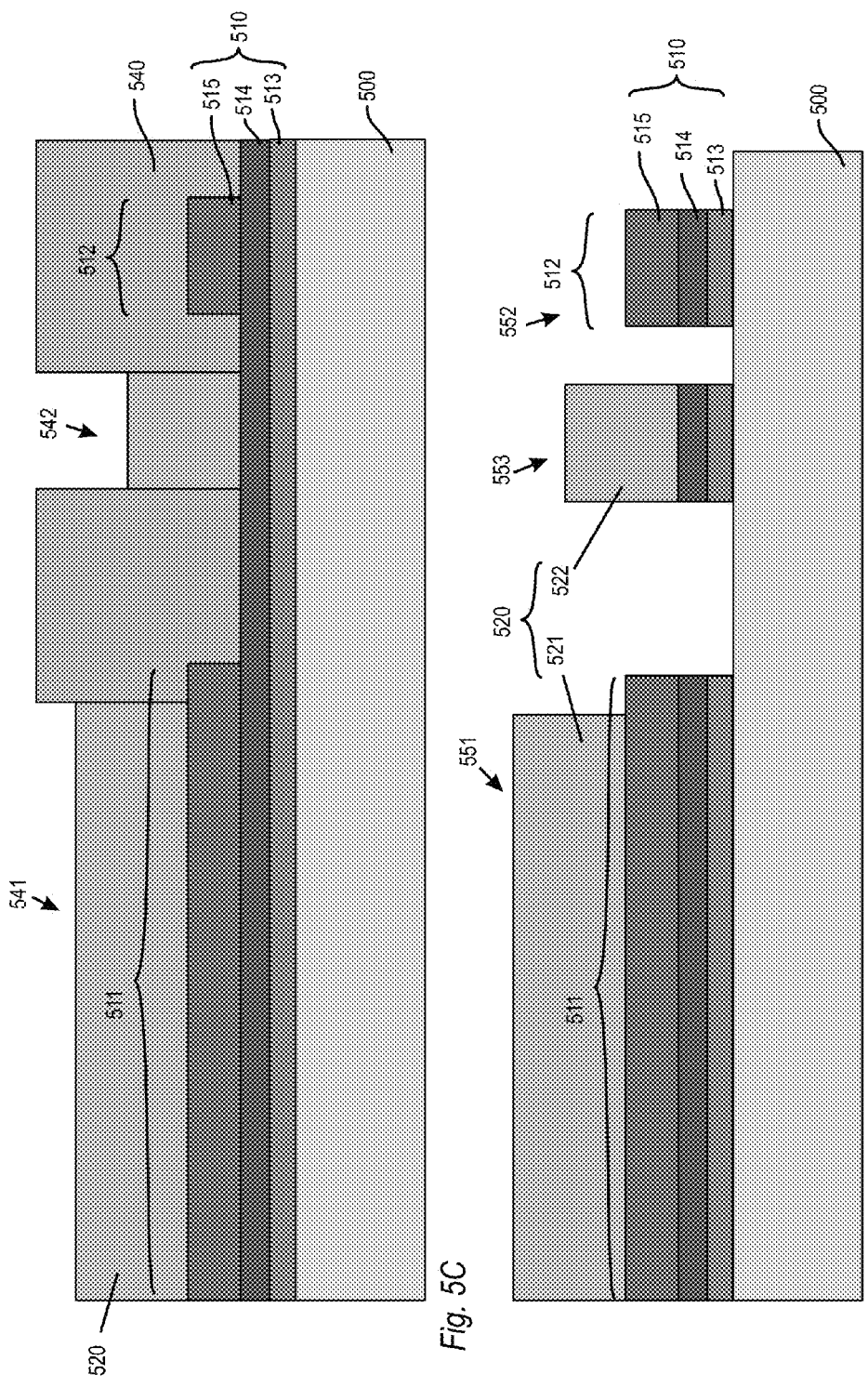

SEMICONDUCTOR DEVICE HAVING A LOCALLY REINFORCED METALLIZATION STRUCTURE AND METHOD FOR MANUFACTURING THEREOF

TECHNICAL FIELD

Embodiments described herein relate to semiconductor devices and methods for manufacturing semiconductor devices.

BACKGROUND

Metal layers are formed on semiconductor materials to provide a good ohmic contact to the semiconductor material and to dissipate heat generated in the semiconductor material during operation of semiconductor devices integrated in the semiconductor material. Depending on the operation of the semiconductor devices, heat pulses may occur which need to be effectively dissipated.

Power semiconductor devices usually only include one metallization level. To increase the capability of the device to dissipate heat, the metal layer is comparably thick which poses problems with respect to structuring of the metal layer and bowing of the semiconductor substrate due to the thick metal layer.

In view of the above, there is a need for improvement.

SUMMARY

According to an embodiment, a method for manufacturing a semiconductor device includes providing a semiconductor substrate having an active area formed in the semiconductor substrate and an edge termination area formed in the semiconductor substrate and laterally surrounding the active area. A first metal layer structure is formed on a first side of the semiconductor substrate, wherein the first metal layer structure includes at least a lower metal layer extending from the active area to the edge termination area and at least an upper metal layer having at least a first metal portion in the active area and at least a second metal portion in the edge termination area. A plating mask is formed on the first metal layer structure to cover the second metal portion while leaving at least a portion of the first metal portion uncovered. A second metal layer structure is plated at least on and in ohmic contact with the first metal portion, wherein the plating mask covers the second metal portion during plating of the second metal layer structure. The lower metal layer of the first metal layer structure is etched using at least the upper metal layer as etching mask after plating of the second metal layer structure, wherein the second metal layer structure, the first metal portion of the upper metal layer and a portion of the lower metal layer form together a common metallization structure in the active area of the semiconductor device.

According to an embodiment, a method for manufacturing a semiconductor device includes providing a semiconductor substrate having a first area formed in the semiconductor substrate and second area formed in the semiconductor substrate. A lower metal layer is formed on a first side of the semiconductor substrate, wherein the lower metal layer extends from the first area to the second area. At least an upper metal layer having at least a first metal portion on and in ohmic contact with the lower metal layer is formed in the first area, and at least a second metal portion on and in ohmic contact with the lower metal layer is formed in the second area. A plating mask is formed to cover at least the second metal portion of the upper metal layer in the second area. A metal layer structure is plated at least on and in ohmic contact with the first metal portion of the upper metal layer, wherein the plating mask covers the second metal portion of the upper metal layer during plating of the metal layer structure. The lower metal layer is etched using at least the upper metal layer as etching mask after plating the metal layer structure.

According to an embodiment, a semiconductor device includes a semiconductor substrate having a first side; at least a first area formed in the semiconductor substrate; at least a second area formed in the semiconductor substrate; a first metal layer structure having at least a first metal portion in the first area and at least a second metal portion in the second area; and a second metal layer structure on and in ohmic contact with the first metal portion in the first area while leaving the second metal portion of the first metal layer structure in the second area uncovered, wherein the second metal layer structure and the first metal portion of the first metal layer structure form together a common metallization structure on the first side of the semiconductor substrate in the first area.

Those skilled in the art will recognise additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIGS. 1A to 1H illustrate a process of a method for manufacturing a semiconductor device according to an embodiment;

FIGS. 2A to 2F illustrate a process of a method for manufacturing a semiconductor device according to an embodiment;

FIGS. 3A to 3F illustrate processes of a method for manufacturing a semiconductor device according to an embodiment;

FIGS. 4A to 4E illustrate processes of a method for manufacturing a semiconductor device according to an embodiment;

FIGS. 5A to 5D illustrate processes of a method for manufacturing a semiconductor device according to an embodiment;

DETAILED DESCRIPTION

Figure 1C:
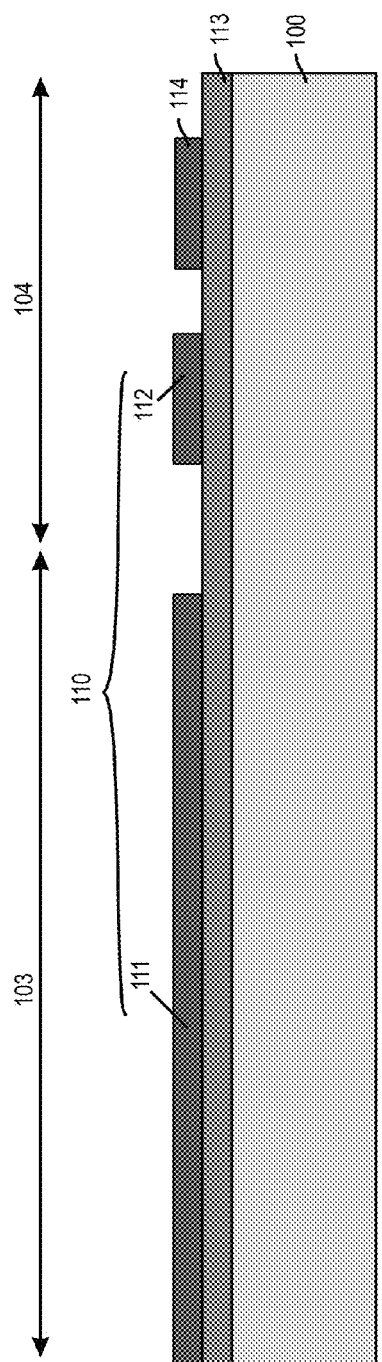

In the following Detailed Description, reference is made to the accompanying drawings, which form a part hereof, and in which are shown by way of illustration specific embodiments in which the invention may be practiced.

In this specification, a second surface of a semiconductor substrate is considered to be formed by the lower or back-side surface while a first surface is considered to be formed by the upper, front or main surface of the semiconductor substrate. Spatially relative terms such as "under," "below," "lower,"

"over," "upper," "lateral," "vertical" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

The terms "electrical connection" and "electrically connected" describes an ohmic connection between two elements.

An embodiment is described with reference to FIGS. 1A to 1H. A semiconductor substrate 100 is provided which has a first side 101, a second side 102 opposite the first side 101, a first area 103 and a second area 104. In this embodiment, the first area 103 represents an active area 103 formed in the semiconductor substrate 100, and the second area 104 represents an edge termination area 104 which is formed in the semiconductor substrate 100 and laterally surrounds the active area 103. The first and second areas 103, 104 are not limited to the active area and edge termination area. For example, the first area 103 can also partially extend into the edge termination area of a power semiconductor device. Depending on the device, the active area 103 typically includes a plurality of identical cells such as FET cells or IGBT cells. In case of a diode, the active area 103 includes one large anode region forming a main pn-junction with an oppositely doped drift region formed in the semiconductor substrate 100. The edge termination area 104 serves for relieving the large potential difference between, for example, the cathode region and the anode region of a power diode or, for example, between the source region and the drain region of a power FET. An edge termination area 104 is typically formed in vertical devices where the current flows from the top side to the bottom side of the semiconductor device.

The semiconductor substrate 100 can be made of any semiconductor material suitable for manufacturing semiconductor devices. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

The doping regions such as source, body, drift and drain for a power FET, or anode, drift and cathode for a power diode, needed for the respective device are typically already formed prior to the following processes.

The semiconductor device can be, for example, a power semiconductor device such as a two-terminal device and a three-terminal device. Examples of two-terminal devices are pn-diodes and Schottky-diodes, while examples of three-terminal devices are FETs and IGBTs. A power transistor is general example of a three-terminal device and can be a FET, an IGBT, a thyristor, or a bipolar transistor. These devices are typically vertical devices having at least one electrode on the first side 101 of the semiconductor substrate 100 and at least another electrode on the second side 102 of the semiconductor substrate 100. The first side 101 can be, for example, the frontside of the semiconductor device, where, for example, the source region of a FET is arranged. The metal regions to be formed function in this case as source metallization. This specification, however, is not limited to vertical devices.

A barrier layer 113 is deposited on the first side 101 of the semiconductor substrate 100 followed by the deposition of a seed layer 114. The barrier layer 113 can be, for example, a copper barrier capable of preventing copper diffusion into the semiconductor substrate 100. The barrier layer 113 can be, for example, a single metal layer or a layer stack. A specific example is a layer stack including a lower layer, which can be about 300 nm thick, followed by an intermediate layer, which can be about 300 nm thick, and an upper layer, which can be about 50 nm thick. The individual layers of the barrier layer 113 can be, for example, selected from W, TiW, Ti, Ta, TaN, TiN, TiWN, Cr, Mo, Ni, NiP and NiMoP. The seed layer 114 serves for promoting electrochemically deposition of a thick metal layer which is described further below. A specific example is an about 600 nm thick Cu layer on the barrier layer 113.

In this embodiment the barrier layer 113 forms a lower metal layer and the seed layer 114 forms here an upper metal layer of a first metal layer structure.

In a further process, an etching mask 130 is formed on the seed layer 114. The etching mask 130 can be, for example, a soft mask such as a photo resist which can be directly photolithographically structured. Alternatively, the etching mask 130 is a hard mask which is structured using a photo mask. The etching mask 130 defines the size and location of a first metal portion and a second metal portion of a first metal layer structure as described below.

In a further process, as illustrated in FIG. 1B, the seed layer 114 is wet-chemically or dry-chemically etched wherein the etching stops at the barrier layer 113. The etching is thus selective relative to the etching mask 130 and the barrier layer 113. Because the seed layer 114 is comparably thin, very fine structures can be formed since the etching mask 130 does not need to be very thick. The seed layer 114 can be structured by this etching process in the active area 103 and the edge termination area 104. In both areas, the structured seed layer 114 forms respective metal portions.

In a further process, as illustrated in FIG. 1C, the etching mask 130 is removed so that the structured seed layer 114 is exposed. The structured seed layer 114 has in this embodiment a first metal portion 111 arranged in the active area 103 and a second metal portion 112 arranged in the edge termination area 104, which are formed by the above etching process. As illustrated in FIG. 1C, the second metal portion 112 can include more than one separate metal region or a single large metal region. For example, the second metal portion 112 can form one or more field plates in the edge termination area 104. Furthermore, the first metal portion 111 can also include one or more regions in the active area 103 which are laterally spaced apart from each other, for example to form a gate structure and a source structure. The first and second metal portions 111, 112 are part of a first metal layer structure 110 which includes the barrier layer 113 and the seed layer 114 in this embodiment.

Figure 1D:
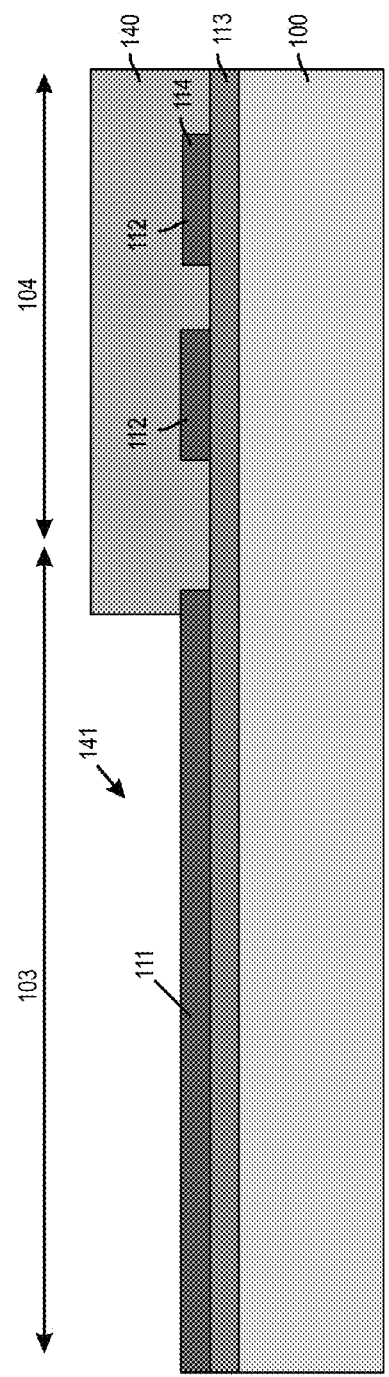

In a further process, as illustrated in FIG. 1D, a plating mask 140 is formed on the first metal layer structure 110 to cover the second metal portion 112 or portions 112 while leaving the first metal portion 111 or portions 111 of the first metal layer structure 110, or most of it, uncovered. The plating mask 140 has at least one opening 141 exposing the first metal portion 111 in the active area 103. In other embodiments, only a part of the first metal portion 111 is exposed in the active area 103. In further embodiments, a part of the second metal portion 112 is also exposed in the edge termination area 104. However, at least a section or part of the second metal portion 112 in the edge termination area 104 of the first metal layer structure 110 is covered by the plating mask 140.

Typically, the plating mask 140 completely covers all second metal portions 112 and all areas of the barrier layer 113 which were exposed by the previous etching process while leaving only the first metal portion or portions 111 uncovered. In further embodiments, as described below, the plating mask 140 also leaves areas of the barrier layer 113 uncovered. In further embodiments, the opening 141, or openings 141, leaves the first metal portion 111 and a portion of the barrier layer 113 adjacent to the first metal portion 111 uncovered so that a connected region is provided which is subsequently filled with metal. The thus formed metal portion has a step at the edge of the first metal portion 111.

In a further process, as illustrated in FIG. 1E, a metal such as copper is electroplated into the opening 141 or openings 141 onto the exposed seed layer 114. The plating results in the formation of a second metal layer structure 120 which is typically thicker than the first metal layer structure 110 which includes the barrier layer 113 and the seed layer 114 in this embodiment. The current for the plating process is carried by the barrier layer 113 which has not been removed during etching of the seed layer 114.

The plating is typically an electrochemical deposition of a metal without being limited thereto.

The second metal layer structure 120, which can also be referred to as second metal layer 120, is thus formed on and in direct contact with the first metal portion 111 of the first metal layer structure 110 to form a good ohmic and thermal conductive contact therewith. Since the plating mask 140 covers the second metal portion 112 during plating of the second metal layer structure 120, no copper is deposited onto the second metal portion 112.

The second metal layer structure 120 (second metal layer) and the first metal portion 111 of the first metal layer structure 110 form together a first common metallization structure 151 in the active area of the semiconductor device. The first common metallization structure 151 includes, in this embodiment, the lower barrier layer 113, the intermediate seed layer 114, and the plated top copper layer forming the second metal layer structure 120. Different thereto, a second common metallization structure 152 is formed by the barrier layer 113 and the structured seed layer 114 in the edge termination area 104. The first and second common metallization structures 151, 152 are still electrically connected by the barrier layer 114.

In a further process, as illustrated in FIG. 1F, the plating mask 140 is removed, for example, wet-chemically, to expose the second metal portion 112 of the first metal layer structure 110.

Turning to FIG. 1G, the barrier layer 113 is etched using the seed layer 114 or the seed layer 114 and the second metal layer structure 120 (plated copper layer) as etching mask. In case that both the seed layer 114 and the second metal layer structure 120 are of the same material such as copper, the etching can be highly selective. Suitable etching processes include dry-chemical or wet-chemical etching. As a result, the second metal portions 112 of the first metal layer structure 110 are fully formed by the structured barrier and seed layers 113, 114 which are now typically electrically insulated from the first metal portion 111. In further embodiments, the second metal portions 112, although structured, can be remain electrically connected with the first metal portion 111, for example when the second metal portion 112 form the inner or first field electrode of the semiconductor device. The structure illustrated in FIG. 1G represents, according to an embodiment, the final structure.

Alternatively, in a further process, as illustrated in FIG. 1H, the seed layer 114 is optionally removed from the barrier layer 113, for example by selective etching relative to the barrier layer 113. If the seed layer 114 and the second metal layer structure 120 are of the same material, the second metal layer structure 120 is also partially etched which slightly reduces its thickness. This is tolerated since the second metal layer structure 120 is comparably thick. This process removes copper from the edge termination area 104, which is beneficial in terms of prevention of copper diffusion. The structure illustrated in FIG. 1H represents, according to another embodiment, the final structure.

In both cases of FIGS. 1G and 1H, the seed layer 114, which is structured before plating the second metal layer structure 120, is used after plating as an etching mask for etching the barrier layer 113. Since the structuring of the seed layer 114 takes place before plating of the comparably thick second metal layer structure 120, this structuring is not affected by large topological height differences caused by the second metal layer structure 120. Therefore, finer structures can be etched into the seed layer 114 and then into the barrier layer 113 so that fine structures can be formed in regions outside the second metal layer structure 120.

In both alternatives, i.e. with or without the optional removal of the seed layer 114 in the edge termination area 104, the second common metallization structure 152 is much thinner than the first common metallization structure 151. In comparison to the second common metallization structure 152, the first common metallization structure 151 additionally includes the second metal layer structure 120 which forms a reinforcing layer to improve heat dissipation and to reduce the electrical resistance. The thickness ratio of the second metal layer structure 120 to the first metal layer structure 110 can be between about 2 to about 500

The above described approach allows selective formation of a thick metallization in the active area 103, or in other areas of interest, while allowing the formation of fine metal structures outside the thick metallization. This approach is beneficial for power devices which typically include only one metallization level. In the present embodiments, the metallization level is formed by at least two layers, one being a thin lower layer (or thin lower metal layer laminate) and the other being a thick upper layer which is formed by plating. Hence, the separate structuring of these two layers provides more freedom and allows the formation of fine structures. For illustration purposes, for the electrochemically plating of the thick second metal layer structure 120 a plating mask is needed which is at least as thick as the layer to be plated. For a typical thickness of the second metal layer structure 120 of power devices, for example about 10 μm, the distance between the openings 141 in the plating mask 140 to form two parallel running metal lines would be about 25 μm. If the same plating mask and the same thickness of the plated metal would be used for forming metal structures also in the edge termination area 104, only very large structures can be formed. Different thereto, since the seed and barrier layer 113, 114 are structured before and covered during plating, these comparably thin layers 113, 114 can form fine structures without the limitation posed by the formation of the plated thick layer. This reduces the space needed in the edge termination area 104 and thus saves costs.

Furthermore, the topology in the edge termination area 104 is reduced as well since only thin metal layers are formed. Different to thick and laterally small metal structures formed by plating thick metal layers, the thin metal structures as formed according to the present embodiments are mechanically more stable which is also beneficial in view of the mechanical stress imposed by further processes such as passivation and formation of backside metallization. Particularly final mounting processes such as diffusion soldering or sintering poses a great challenge for metal structures having a large aspect ratio in the edge termination area 104.

In addition, since the total area covered by the thick second metal layer structure 120 is reduced, the mechanical stress exerted by the thick second metal layer structure 120 is reduced which prevents or at least reduces bowing of the semiconductor substrate 100.

In an embodiment, the second metal layer structure 120 forming a reinforcing layer is limited to the active area 103 of the semiconductor device. The second metal layer structure 120 can completely or only partially cover the first metal layer structure 110 in the active area 103. This allows the beneficial properties of having a thick metallization in the active area 103 to be maintained while keeping the metallization thin in the edge termination area 104 to allow finer structures. According to one embodiment, the seed layer 114, which is structured using an etching process to form fine structures, is also used as etching mask when etching the barrier layer 113 after plating the second metal layer structure 120. Hence, the single metallization level or structure of the power semiconductor is formed by two structuring processes, wherein the first structuring process is an etching process and the second structuring process is a plating process into a thick mask.

The contact area between the first metal portion 111 and the second metal layer structure 120 is typically much larger than the thickness of the second metal layer structure 120. For illustration purposes, the ratio between a lateral extension of the contact area to the thickness of the second metal layer structure 120 is at least 5:1.

With reference to FIGS. 2A to 2F, a further embodiment is described. As illustrated in FIG. 2A, a semiconductor substrate 200 having a first side 201 and a second side 202 is provided followed by the deposition of a barrier layer 213 and a seed layer 214 on the first side 201 of the semiconductor substrate 200. The barrier layer 213 and seed layer 214 are part of a first metal layer structure 210 and cover the active area 203 and the edge termination area 204 of the semiconductor substrate 200. In this embodiment, the barrier layer 213 and the seed layer 214 together form the lower metal layer of the first metal layer structure 210. Since this process is similar to the process shown in FIG. 1A, reference is made to the description of FIG. 1A.

As illustrated in FIG. 2A, a first plating mask 245 is formed on the seed layer 214 having openings 246 defining the size and location of one or more first metal portions 211 and one or more second metal portions 212 of the first metal layer structure 210. In this embodiment, the first metal layer structure 210 includes in addition to the barrier layer 213 and the seed layer 214 a first metal layer 215 which is formed by plating in the openings 246. In this embodiment, the first metal layer 215 forms the upper metal layer of the first metal layer structure 210. A metal such as copper is plated in the openings 246 of the first plating mask 245 on and in ohmic contact with the seed layer 214. The first metal layer 215 includes metal portions which form the first and second metal portions 211, 212 of the first metal layer structure 210.

The first plating mask 245 can be a comparably thin photo resist which allows the formation of fine structures, as the first metal layer 215 can be thin. For example, the first metal layer 215 can be about 50 nm to about 1000 nm thick, the barrier layer 213 can be about 50 nm to about 1000 nm thick, and the seed layer 214 can be about 50 nm to about 1000 nm thick, so that the total thickness of the first metal layer structure 210 formed by the barrier layer 213, the seed layer 214 and the first metal layer 215 can be about 150 nm to about 3000 nm. This is still less than the thickness of the second metal layer structure 220, for example about 10 μm, to be formed subsequently.

In a further process, as illustrated in FIG. 2B, the first plating mask 245 is removed. The first metal layer structure 210 thus includes the first metal portion 211 arranged in the active area 203 and the second metal portion 212 arranged in the edge termination area 204. The first and second metal portions 211, 212 refer to a lateral structure of the first metal layer structure 210. The vertical structure of the first metal layer structure 210 is given by the sequence of the metal layers starting with this barrier layer 213, followed by the seed layer 214 and the first metal layer 215. The first metal layer structure 210 thus has at least an upper metal layer and a lower metal layer. In the embodiment of FIGS. 2A to 2F, the upper metal layer is formed by the first metal layer 215 while the lower metal layer is formed by the barrier layer 213 and seed layer 214. In other embodiments, as for example in the embodiment illustrated in FIGS. 1A to 1H, the upper metal layer is formed by the seed layer 114 and the lower metal layer is formed by the barrier layer 113.

As illustrated in FIG. 2C, a second plating mask 240 is formed on the first side 201 of the semiconductor substrate 200 to completely cover the second metal portion 212 of the first metal layer structure 210 while leaving most or all of the first metal portion 211 of the first metal layer structure 210 uncovered. The second plating mask 240 is a resist mask having a sufficient thickness for allowing plating of a thick metal portion on the exposed first metal portion 211 of the first metal layer structure 210.

For example copper is plated electrochemically on the first metal portion 211 and forms a thick second metal layer structure 220 on and in ohmic contact with the first metal layer structure 210. The second metal layer structure 220 can also be referred to as second metal layer. The first metal layer structure 210 and the second metal layer structure 220 have a large common contact region in the active area 203 to improve the ohmic contact as well as to improve the thermal conductivity of the layer stack. The current for the electrochemical deposition is carried by the barrier layer 213 and the seed layer 214.

Different to the plating process in FIG. 1E, the seed layer 213 is unstructured so that the electrical resistance of the lower metal layer formed by the barrier layer 213 and the seed layer 214 is reduced which is beneficial for the plating processes to form the first metal layer 215 and the second metal layer structure 220.

FIG. 2D illustrates the removal of the second plating mask 240, for example by wet-chemical or dry-chemical etching.

In a further process, as illustrated in FIG. 2E, the seed layer 214 and the barrier layer 213 are etched using the metal portions of the first metal layer 215 as etching mask. Furthermore, the second metal layer structure 220 can also serve as etching mask. The resulting structure includes a first common metallization structure 251 formed by the first metal portion 211 of the first metal layer structure 210 and the second metal layer structure 220, and a second common metallization structure 252 formed by the second portion or portions 212 of the first metal layer structure 210. The first common metallization structure 251 includes a layer stack formed by the barrier layer 213, the seed layer 214, the first metal layer 215, and the second metal layer structure 220 forming a reinforcing layer. The second common metallization structure 252 includes the barrier layer 213, the seed layer 214, and the first metal layer 215, but not a reinforcing layer. Hence the second common metallization structure 252 is much thinner than the first common metallization structure 251 and forms electrical structures in the edge termination area 204, while the first common metallization structure 251 forms, for example, the source metallization in the active area 203. The structure illustrated in FIG. 2E represents, according to an embodiment, the final structure.

In a further optional step, the seed layer 214 and the metal portions of the first metal layer 215 are removed from the barrier layer 213 in the edge termination area 204. If the metal portions of the first metal layer 215 and the second metal layer structure 220 (second metal layer) are of the same material, the second metal layer structure 220 is also partially removed. However, since the second metal layer structure 220 has a large thickness in comparison to the metal portions of the first metal layer 215, this partial removal does not affect the function of the second metal layer structure 220. If needed, the partial removal can be taken into account when forming the second plating mask 240 to allow plating of a sufficiently thick second metal layer structure 220.

The removal of the seed layer 214 and the first metal layer 215 in the edge termination area 204 is particularly beneficial when both layers or at least one of these layers include copper so that a copper-free edge termination area 204 is formed to prevent that copper can diffuse into the semiconductor substrate 200 or any insulating layer.

When removing the seed layer 214 and the first metal layer 215 in the edge termination area 204, the second common metallization structure 252 is formed by the barrier layer 213 only. The structure illustrated in FIG. 2F represents, according to another embodiment, the final structure.

The above described improvement with respect to the formation of fine metal structures is also possible with the present embodiment which forms, in comparison to the embodiment of FIGS. 1A to 1H, an additional first metal layer 215 by plating. The first metal layer 215, however, is typically much thinner than the second metal layer structure 220. For example, the second metal layer structure 220 can have a thickness which is about 4 to 1000 times larger than the thickness of the first metal layer 215. For example, the first metal layer 215 can be about 0.3 to about 0.5 µm or even up to 3 µm, while the second metal layer structure 220 can have a thickness of up to 50 µm or even up to 100 µm.

Turning to FIGS. 3A to 3F, a further embodiment is described. As illustrated in FIG. 3A, a semiconductor substrate 300 having a first side 301 and a second side 302 is provided followed by the deposition of a barrier layer 313 and a seed layer 314 on the first side 301 of the semiconductor substrate 300. The barrier layer 313 and the seed layer 314 can be of the materials and can have respective thicknesses as described in connection with the embodiment of FIGS. 1A to 1H.

A first plating mask 345 is formed on the seed layer 314 having openings 346 defining the size and location of one or more first metal portions 311 in the active area 303 and one or more second metal portions 312 of the first metal layer structure 310 in the edge termination area 304. In this embodiment, the first metal layer structure 310 includes, in addition to the barrier layer 313 and the seed layer 314, a first metal layer 315 which is formed by plating. A metal such as copper is plated in the openings 346 of the first plating mask 345 on and in ohmic contact with the seed layer 314. The first metal layer 315 includes metal portions which form the first and second metal portions 311, 312 of the first metal layer structure 310. This process is basically the same as shown in FIG. 2A. Therefore, reference is made to the further details given there.

In a further process, as illustrated in FIG. 3B, the first plating mask 345 is removed. The first metal layer structure 310 thus includes the first metal portion 311 arranged in the active area 303 and the second metal portion 312 arranged in the edge termination area 304 as for example described above. The first metal layer 315 and the seed layer 314 together form the upper metal layer of the first metal layer structure 310 in this embodiment. Different to the process as illustrated in FIGS. 2A to 2F, the seed layer 314 is etched using the first metal layer 315 as etching mask before a subsequent plating of a thick reinforcing layer. The barrier layer 313 only forms the lower metal layer of the first metal layer structure 310 in this embodiment.

Similar to the embodiment of FIGS. 2A to 2F, the vertical structure of the first metal layer structure 310 is given by the sequence of the metal layers starting with this barrier layer 313, followed by the seed layer 314 and the first metal layer 315. The first metal layer structure 310 thus has also at least an upper metal layer and a lower metal layer.

As illustrated in FIG. 3C, a second plating mask 340 is formed on the first side 301 of the semiconductor substrate 300 to cover the second metal portion 312 of the first metal layer structure 310 while leaving most or all of the first metal portion 311 of the first metal layer structure 310 uncovered as described with reference to FIG. 2C. Then, as described above, copper is plated electrochemically on the first metal portion 311 to form a thick second metal layer structure 320 (second metal layer) on and in ohmic contact with the first metal layer structure 310. The first metal layer structure 310 and the second metal layer structure 320 have a large common contact region to improve the ohmic contact as well as to improve the thermal conductivity of this layer stack. Since the seed layer 314 has been etched prior to plating, the current for the plating process is only carried by the barrier layer 313. The second plating mask 340 is then removed, for example by wet-chemical or dry-chemical etching, as indicated by FIG. 3D.

As illustrated in FIG. 3E, the barrier layer 313 is etched using the metal portions of the first metal layer 315 and the seed layer 314 as etching mask. Furthermore, the second metal layer structure 320 can also serve as etching mask. The resulting structure includes a first common metallization structure 351 formed by the second metal layer structure 320 and the first metal portion 311 of the first metal layer structure 310, and a second common metallization structure 352 formed by the second portion or portions 312 of the first metal layer structure 310. The first common metallization structure 351 includes a layer stack formed by the barrier layer 313, the seed layer 314, the first metal layer 315, and a reinforcing layer formed by the second metal layer structure 320. The second common metallization structure 352 includes the barrier layer 313, the seed layer 314, and the first metal layer 315, but not a reinforcing layer. Therefore, the second common metallization structure 352 is much thinner than the first common metallization structure 351. The structure illustrated in FIG. 3E represents, according to another embodiment, the final structure.

In a further optional step, the seed layer 314 and the metal portions of the first metal layer 315 can be removed from the barrier layer 313 in the edge termination area 304 as described above. As a result a structure as illustrated in FIG. 3F is produced which represents the final structure of this embodiment.

Figure 4C:
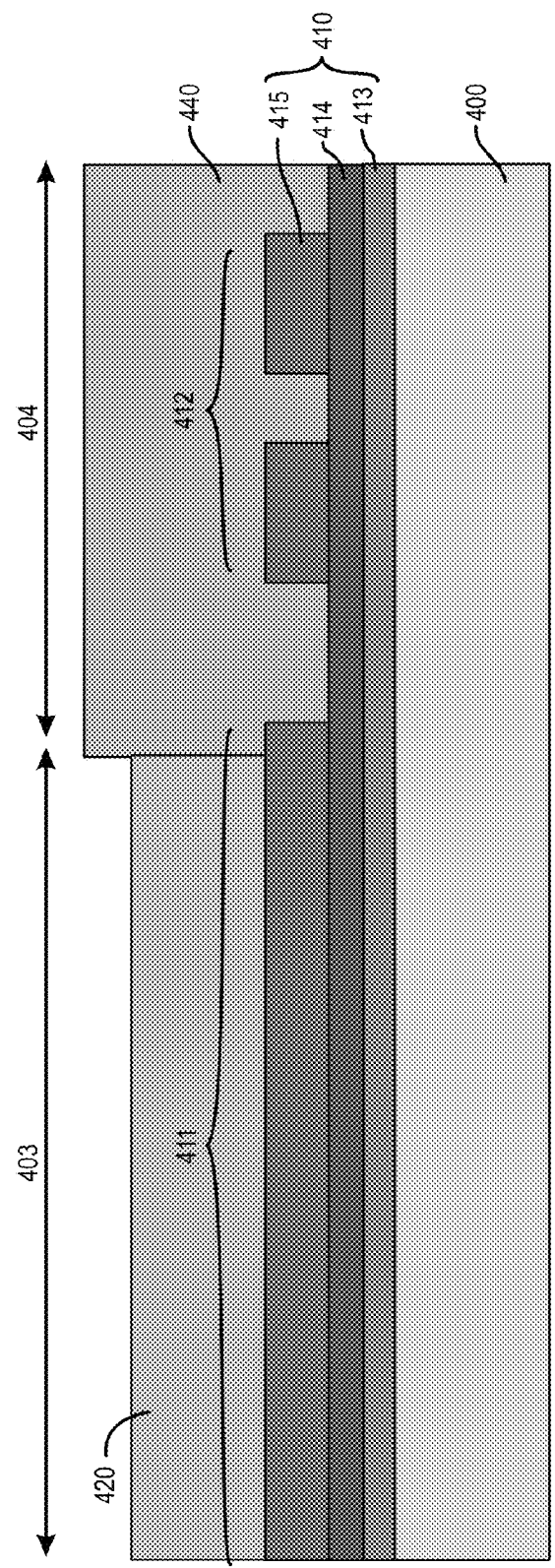

With reference to FIGS. 4A to 4E, a further embodiment is described. FIG. 4A illustrates a semiconductor substrate 400 having a first side 401 and a second side 402, and a barrier layer 413, an intermediate metal layer 414 and a first metal layer 415 formed in this order on the first side 401 of the semiconductor substrate 400. The barrier layer 413, the intermediate metal layer 414, and the first metal layer 415 form a first metal layer structure 410 and cover the active area 403 and the edge termination area 404 of the semiconductor substrate 400. The barrier layer 413, the intermediate metal layer 414 and the first metal layer 415 can be formed as described above. Instead of plating, the first metal layer 415 can also be deposited by other processes. The first metal layer 415, can be, for example, made of copper.

As illustrated in FIG. 4B, an etching mask 430 is formed on the first metal layer 415 to define first metal portions 411 and second metal portions 412 which are subsequently formed by etching. The etching can stop at the intermediate metal layer 414 or at the barrier layer 413. Hence, at least the barrier layer 413 remains intact and serves as electrical connection during a subsequent plating process.

In this embodiment, the barrier layer 413 and the intermediate metal layer 414 form together the lower metal layer of the first metal layer structure 410. The intermediate metal layer 414 does not need to be a seed layer since the first metal layer 415 is formed by processes other than plating. Therefore, the intermediate metal layer 414 can be formed of any metal such as W, TiW, Ti, Ta, TaN, TiN, TiWN, Cr, Mo, Ni, NiP, NiMoP, Cu, Ni, Ag, Cr, Mo, Al, Al-alloys such as AlSiCu, and any combination thereof.

The first metal layer 415 forms in this embodiment the upper metal layer of the first metal layer structure 410 and additionally functions as seed layer for following plating process. The first metal layer 415 can be formed, for example of one or more of Cu, Ni, Ag, Cr, and Mo.

After removing the etching mask 430, a plating mask 440 is formed as described above to cover the second metal portions 412 while leaving all or most of the first metal portion 411 uncovered, followed by plating of, for example, copper to form a second metal layer structure 420 forming a thick reinforcing metal layer (second metal layer) on the first metal portion 411 of the first metal layer structure 410. These processes are illustrated in FIG. 4C.

The following processes as illustrated in FIGS. 4D and 4E are similar to the processes as illustrated in FIGS. 2E and 2F and include removal of the plating mask 440 and optional removal of the first metal layer 415 and the intermediate metal layer 414 in the edge termination area 404 relative to the second metal layer structure 420 and the barrier layer 413. Hence, the first metal layer 415 thus only serves as etching mask for the intermediate metal layer 414 and the barrier layer 413. The structure illustrated in FIGS. 4D and 4E represent final structures according to the described embodiments.

The above processes also leads to the formation of a first common metallization structure 451 and a second common metallization structure 452 as described above.

Figure 5A:
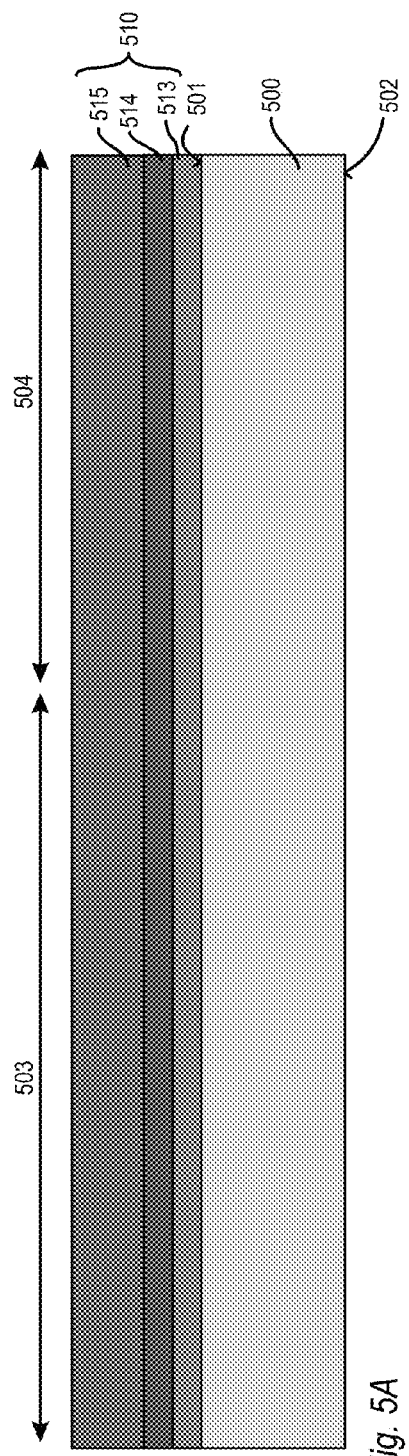

With reference to FIGS. 5A to 5D, a further embodiment is described, which is a variation of the embodiment illustrated in FIGS. 4A to 4E. Similar to FIG. 4A, FIG. 5A illustrates providing a semiconductor substrate 500 with a first side 501 and a second side 502, and forming, in this order, a barrier layer 513, a seed layer 514 and a first metal layer 515 on the first side 501 of the semiconductor substrate 500. The same materials and processes as described above can be used. The barrier layer 513 and the seed layer 514 form in this embodiment the lower metal layer of the first metal layer structure 510 while the first metal layer 515 forms the upper metal layer of the first metal layer structure 510.

Figure 5B:
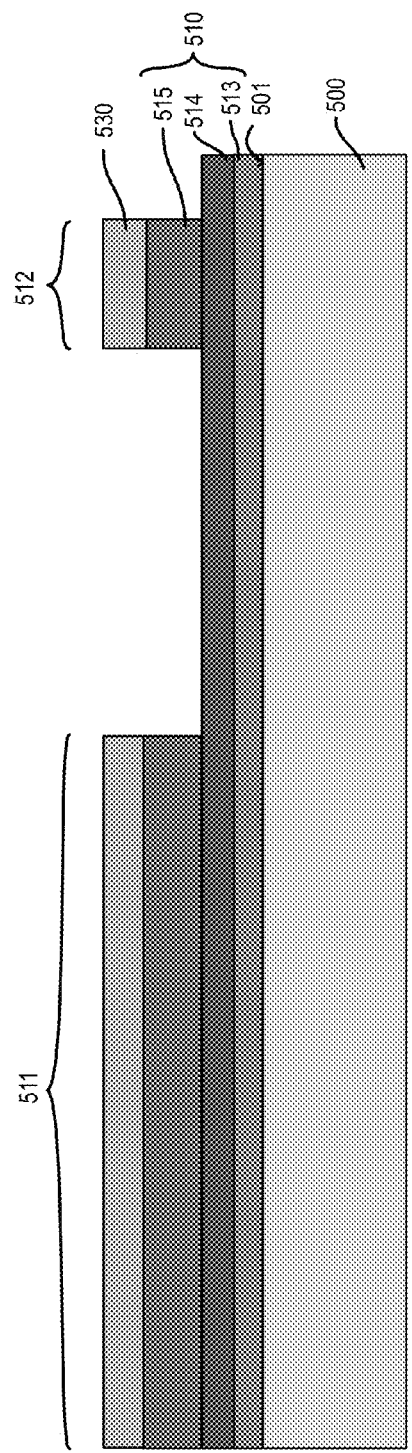

In a further process, as illustrated in FIG. 5B, an etching mask 530 is formed on the first metal layer 515 to define first metal portions 511 in the active area 503 and one or more second metal portions 512 in the edge termination area 504. These metal portions are subsequently formed by etching. The etching stops at the seed layer 514 as described above. Hence, the seed layer 514 and the barrier layer 513 remain intact and together serve as electrical connection during a subsequent plating process. These processes are basically the same as the processes of FIG. 4B.

FIG. 5C illustrates a process which is different from the process of FIG. 4C. A plating mask 540 is formed which has an opening 541 exposing the first metal portion 511 in the active area 503 as described above. In addition, the plating mask 540 includes a further opening 542 which exposes a portion of the seed layer 514 in the active area 503 and/or the edge termination area 504. The second metal portion 512 in the edge termination area 504 is typically completely covered by the plating mask 540. Hence, the opening 541 defines the size and location of a first portion of the second metal layer structure 520 above the first metal layer 515, and the further opening 542 defines the size and location of a second portion of the second metal layer structure 520 above the seed layer 514 where the first metal layer 515 has been removed.

Different to the processes described in connection with other embodiments, the plating mask 540 does not completely cover the edge termination region 504 but leaves portions of the seed layer 514 uncovered to allow plating of metal. Hence, additional metal can be plated in portions other than the first metal portion 511 and the second metal portion 512 of the first metal layer structure 510.

In a further process, as still illustrated in FIG. 5C, a metal such as copper is plated in the opening 541 and the further opening 542 of the plating mask 540 to form the first portion 521 and the second portion 522 of the second metal layer structure 520. The second portion 552 of the second metal layer structure 520 is not formed on the first metal layer 515 but directly on the seed layer 513.

Since metal is plated onto the seed layer 514 and the first metal layer 515, both layers functions as seed layer for the plating process. The first metal layer 515 and the seed layer 514 can be formed, for example of one or more of Cu, Ni, Ag, Cr, and Mo. However, the seed layer 514 and the first metal layer 515 are formed of different metals to allow selective etching of the first metal layer 515 relative to the seed layer 514.

As illustrated in FIG. 5D, after removal of the plating mask 540, the seed layer 514 and the barrier layer 513 are etched using the first portion 521 and the second portion 522 of the second metal layer structure 520 and the portions 511, 512 of the first metal layer 515 as etching mask. The etching is thus typically selective relative to the material of the first metal layer 515 and the second metal layer structure 520.

The first portion 521 of the second metal layer structure 520 forms together with the first metal portion 511 of the first metal layer structure 510, which includes a layer stack of the barrier layer 513, the seed layer 514, and the first metal layer 515, a first common metallization structure 551. The first metal layer 515, the seed layer 514 and the barrier layer 513 of the second metal portion 512 of the first metal layer structure 510 together form a second common metallization structure 552. The second portion 552 of the second metal layer structure 520 forms together with the seed layer 514 and the barrier layer 513 a third common metallization structure 553. The three common metallization structures 551, 552, 553 can be separate and electrically insulated from each other. Alternatively, these common metallization structures 551, 552, 553 can be electrically connected with each other, or only some of them can be electrically connected with each other. It is further possible that a connected conductive structure including all of the three common metallization structures 551, 552, 553 is formed. The structure illustrated in FIG. 5D represents, according to another embodiment, the final structure.

The variation illustrated in FIGS. 5A to 5D can also be applied to all of the other embodiments since the respective plating masks 140, 240, 340, 440, and 540 can be structured independently relative to the pre-structured seed-layer 114, 214, 314, 414, 514 and/or pre-structured barrier layer 113, 213, 313, 413, 513, or to the pre-structured first metal layer 215, 315, 415, 515. It is thus possible to form a second portion 522 of the second metallization structure 520 virtually in any area of the semiconductor substrate 500 including the active area 503 and the edge termination area 504. This provides more freedom in tailoring the metallization structure of the whole device.

It is further possible to plate the second metal layer structure 520 only onto the seed layer 514 so that no first metal portion 521 is formed on the first metal portion 511.

The three common metallization structures 551, 552, 553 typically have different thicknesses with the first common metallization structure 551 having the largest thickness and the second common metallization structures 552 having the smallest thickness. The thickness relation depends on the thicknesses of the individual metal layers constituting the respective common metallization structure.

Depending on the actual processes used, it is possible to form different metallization structures which can include a first common metallization structure 551 formed by the barrier layer 513, the seed layer 514, the first metal layer 515 and the thick second metallization structure 520 (also referred to as second metal layer 520), a second common metallization structure 552 formed by the barrier layer 513, the seed layer 514 and the first metal layer 515, and a third common metallization structure 553 formed by the barrier layer 513, the seed layer 514 and the thick second metallization structure 520 (second metal layer 520). When using the processes of FIGS. 2A to 2F and 4A to 4E, the second common metallization structure 552 is formed by the barrier layer 513 only, while the layer stack of the first common metallization structure 551 and the third common metallization structure 553 remains the same. The resulting structure is similar to the structure as illustrated in FIG. 5D, with the exception that the seed layer 514 and the first metal layer 515 of the second common metallization structure 552 is removed.

In any of the above described embodiments, the seed layer and the second metal layer structure (second metal layer) can be formed of the same metal. In addition to that, the seed layer and the first metal layer are typically formed of different metals to allow selective etching. Furthermore, the first metal layer and the second metal layer can be formed of the same metal but are typically formed of different metals. The barrier layer can be about 50 nm to about 1000 nm thick. The seed layer can be about 50 nm to about 1000 nm thick or about 100 nm to about 1000 nm thick. The first metal layer can be about 50 nm to about 1000 nm thick, with a typical thickness of about 500 nm. The second metal layer can be about 3 µm to about 100 µm thick, with a typical thickness of 5 to 20 µm.

Furthermore, the barrier layer can include, in addition or alternatively to the above mentioned metals W, TiW and Ti, one or more of Ta, TaN, TiN, TiWN, Cr, Mo, Ni, NiP and NiMoP. The seed layer can also be formed, alternatively or in addition to the above mentioned Cu, of one or more of Ni, Ag, Cr, and Mo. These metals also allow plating of Cu or of any of the following metals, which can also be used as material for the second metal layer structure (second metal layer): Ni, Ag, Cr and Mo.

The common metallization structure (first common metallization structure), is formed, according to an embodiment, by the second metal layer structure (second metal layer), the first metal portion of the upper metal layer and a portion of the lower metal layer which is covered by first metal portion of the upper metal layer.

Different thereto, the second common metallization structure does not include the second metal layer structure and is formed by the second metal portion of the upper metal layer and a portion of the lower metal layer which is covered by the second metal portion of the upper metal layer.

The upper metal layer (first metal layer), and in some embodiments also the second metal layer structure (second metal layer), forms an etching mask for structuring the lower metal layer. This etching mask is typically a hard mask since these layers are formed of metals. Furthermore, since the first metal layer and the second metal layer structure (second metal layer) can be much thicker than the lower metal layer, formed e.g. by the barrier layer and the seed layer or by the barrier layer and the intermediate metal layer, the etching of the lower metal layer does not need to be highly selective with respect to the first metal layer and the second metal layer structure (second metal layer).

Specifically with respect to embodiments of FIGS. 1A to 1H, 4A to 4E, and 5A to 5D, the method includes providing a semiconductor substrate having an active area formed in the semiconductor substrate and an edge termination area formed in the semiconductor substrate and laterally surrounding the active area; forming a first metal layer structure comprising at least an upper metal layer and a lower metal layer on a first side of the semiconductor substrates in the active area and the edge termination area; forming a mask defining the size and location of a first metal portion of the first metal layer structure in the active area and a second metal portion of the first metal layer structure in the edge termination area; etching the upper metal layer using the mask as etching mask to form the first metal portion in the active area and the second metal portion in the edge termination area, wherein the etching stops at the lower metal layer; forming a plating mask to cover the second metal portion in the edge termination area; plating a second metal layer structure on and in ohmic contact with the first metal portion of the first metal layer structure, wherein the plating mask covers the second metal portion during plating of the second metal layer structure, and wherein the second metal layer structure and the first metal portion of the first metal layer structure form together a common metallization structure in the active area of the semiconductor device; and etching the lower metal layer using the upper metal layer as etching mask after plating the second metal layer structure.

The upper metal layer is formed by either the first metal layer or the seed layer while the lower metal layer is formed by the seed layer or the seed and barrier layer as described above.

According to an embodiment, a method for manufacturing a semiconductor device includes providing a semiconductor substrate having an active area formed in the semiconductor substrate and an edge termination area formed in the semiconductor substrate and laterally surrounding the active area. A lower metal layer is formed on a first side of the semiconductor substrates, wherein the lower metal layer extends from the active area to the edge termination area. At least an upper metal layer having at least a first metal portion on and in ohmic contact with the lower metal layer is formed in the active area, and at least a second metal portion on and in ohmic contact with the lower metal layer is formed in the edge termination area. A plating mask is formed to cover at least the second metal portion of the upper metal layer in the edge termination area. A metal layer structure is plated at least on and in ohmic contact with the first metal portion of the upper metal layer, wherein the plating mask covers the second metal portion of the upper metal layer during plating of the metal layer structure. The lower metal layer is etched using at least the upper metal layer as etching mask after plating the metal layer structure, wherein the metal layer structure, the first metal portion of the upper layer and a portion of the lower metal layer covered by the first metal portion of the upper metal layer form together a common metallization structure in the active area of the semiconductor device; and wherein the second portion of the upper metal layer and a portion of the lower metal layer covered by the second metal portion of the upper metal layer form together a metallization structure in the edge termination area of the semiconductor device.

Figure 6:
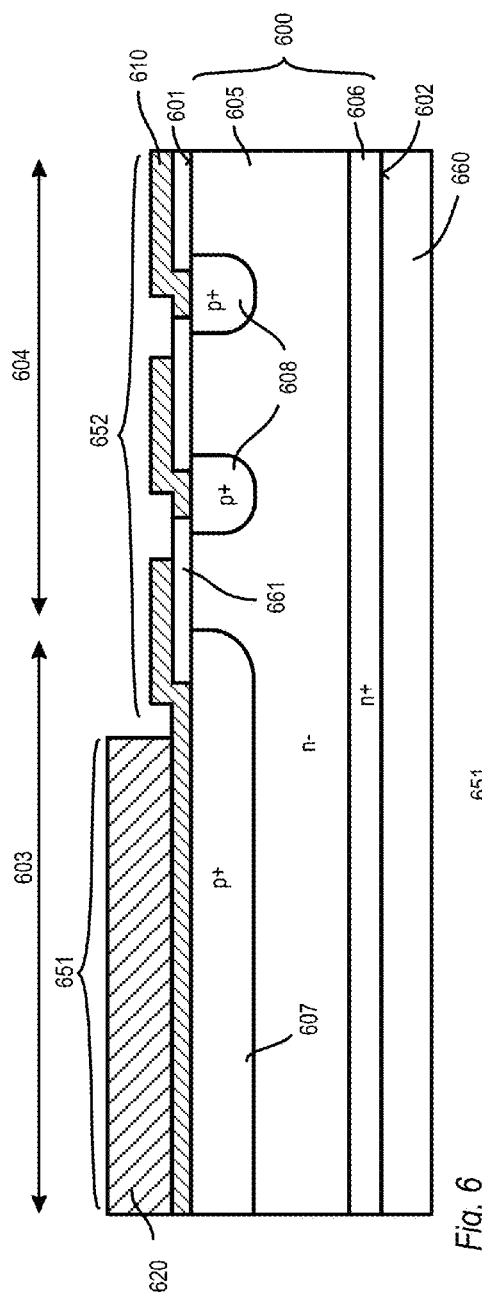
FIG. 6 illustrates a semiconductor device according to an embodiment.

With reference to FIG. 6 a semiconductor device according to an embodiment is described. The semiconductor device illustrated in FIG. 6 is a power diode including a semiconductor substrate 600 having a first side 601 and a second side 602. A highly p-doped anode region 607 is formed in the upper region of the semiconductor substrate 600. A highly n-doped cathode region 606 is formed at the second side 602 of the semiconductor substrate 600. A weakly n-doped or intrinsically doped drift region 605 is arranged between the anode region 607 and the cathode region 606. In the active area 603, which substantially corresponds to the lateral extension of the anode region 607, a first common metallization structure 651 is formed by any of the above described processes. The first common metallization structure 651 includes the first metal layer structure 610 and the second metal layer structure 620. As illustrated in FIG. 6, the second metal layer structure 620 is limited to the active area 603 while the first metal layer structure 610 also partially extends into the edge termination area 604.

Portions of the first metal layer structure 610, which are electrically insulated from the first common metallization structure 651 form the second common metallization structure 652 in the edge termination area 604. These portions, for example, can form field plates which are electrically in contact with highly doped floating regions or field rings 608. The field plates are electrically insulated from the drift region 605 by respective insulating layers 661. In the embodiment shown in FIG. 6, the second common metallization structure 652 also partially extends into the active area 603.

The portion of the first metal layer structure 610 which extends from the active area 603 into the edge termination area 604 also forms a field plate there, which is in electrical contact with the anode region 607.

A backside metallization 660 is formed on the second side 602 of the semiconductor substrate 600 to form a cathode metallization in ohmic contact with the cathode region 606.

The first common metallization structure 651 forms an anode metallization in this embodiment.

Figure 7:
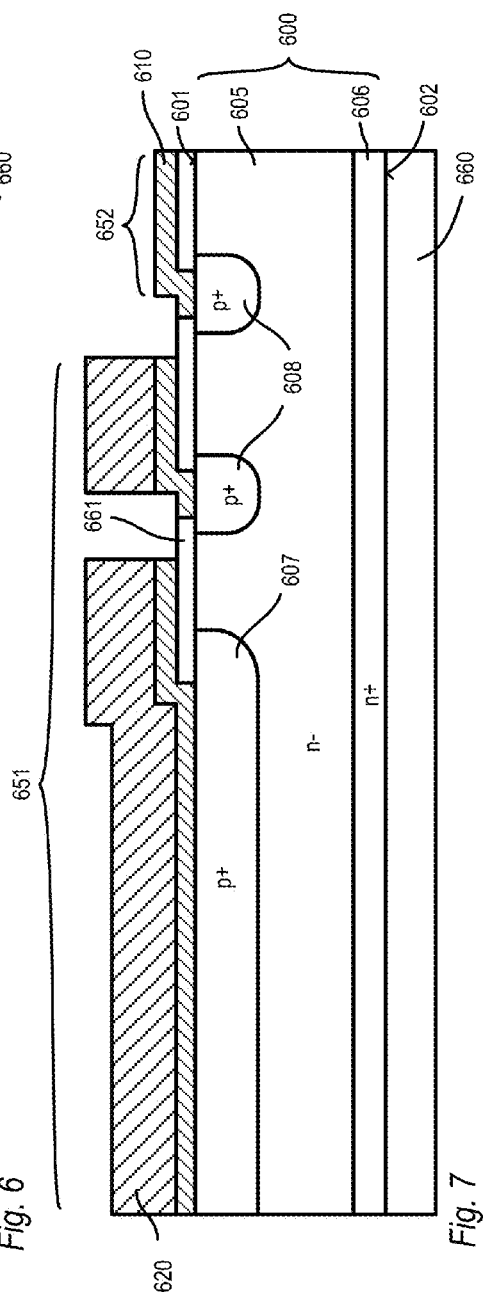
FIG. 7 illustrates a semiconductor device according to an embodiment.

FIG. 7 illustrates a variation of the embodiment of FIG. 6 with respect to the first common metallization structure 651. The second metal layer structure 620 can also partially extend into the edge termination area 604 to cover also portions of the first metal layer structure 610. Hence, the reinforcing layer formed by the second metal layer structure 620 is also formed in the edge termination area 604 so that the first common metallization structure 651 extends into the edge termination area 604. However, at least one portion of the first metal layer structure 610 remains uncovered in the edge termination area 604 to form there the second common metallization structure 652.

Figure 8A:
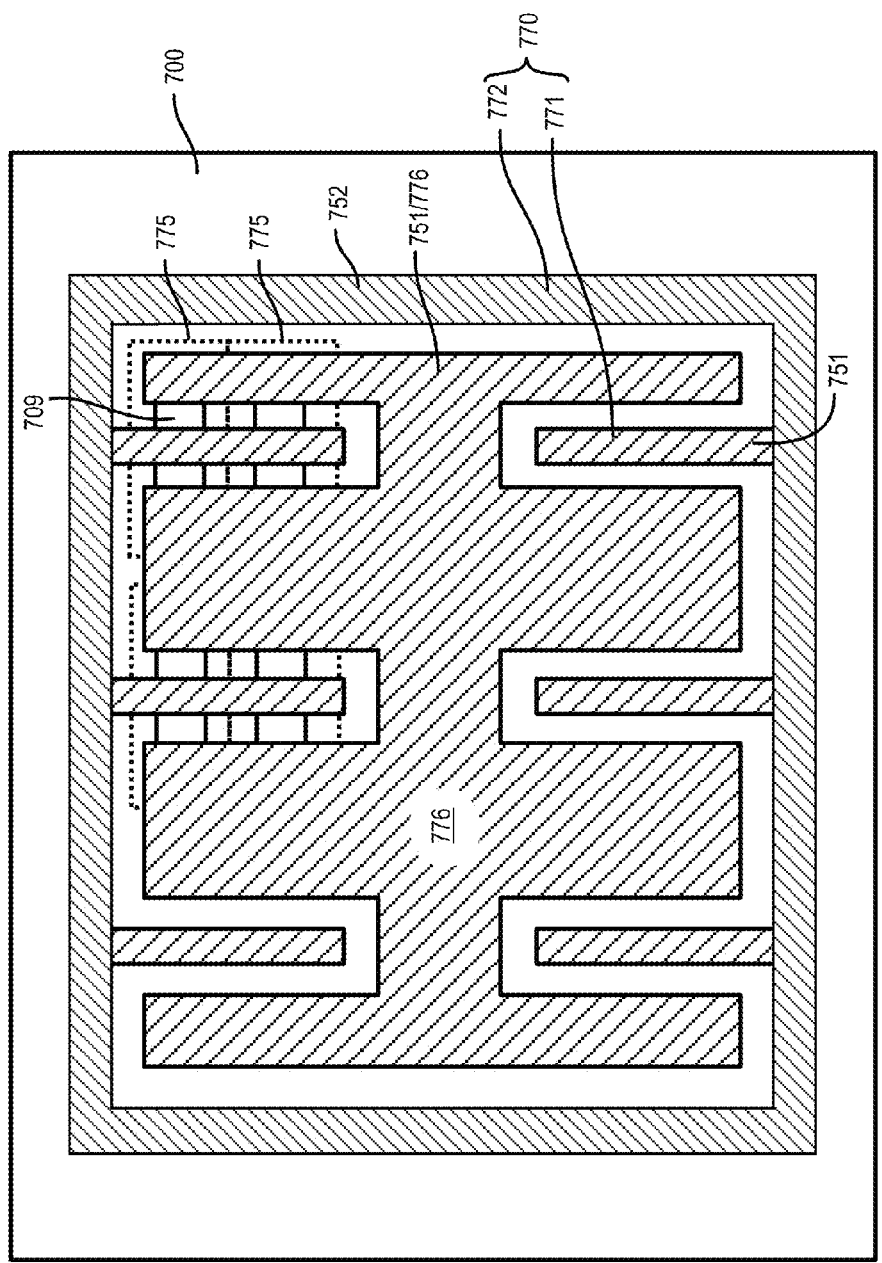
FIG. 8A illustrates a semiconductor device according to an embodiment.

FIG. 8A illustrates a top view of a semiconductor device according to a further embodiment. A power FET including a plurality of FET cells 775 is formed in a semiconductor substrate 700. The location of the source regions 709 of the FET cells 775 is schematically illustrated. On the upper or first side of the semiconductor substrate 700, a gate structure 770 is disposed which includes a gate runner 772 and a plurality of gate fingers 771 extending from the gate runner 772. The active area of the power FET substantially corresponds to the inner area defined by the gate runner 772.

A source metallization 776 is formed within the gate runner 772 and in ohmic contact with the source regions 709.

The source metallization 776 is formed by a portion of the first common metallization structure 751 which includes the first metal layer structure and the second metal layer structure as described above. The gate structure 770 is partially formed by portions the first common metallization structure 751 and the second common metallization structure 752. Specifically, the gate runner 772 is formed by a portion of the second common metallization structure 752 which only includes the first metal layer structure, and the gate fingers 771 are formed by portions of the first common metallization structure 751 which includes the first metal layer structure and the second metal layer structure. Hence, the gate fingers 771 are much thicker than the gate runner 772.

FIG. 8A does not illustrate metal structures in the edge termination area. However, field plates or other structures can be formed in the edge termination area which structures can either include the first common metallization structure 751 or the second common metallization structure 752.

Figure 8B:
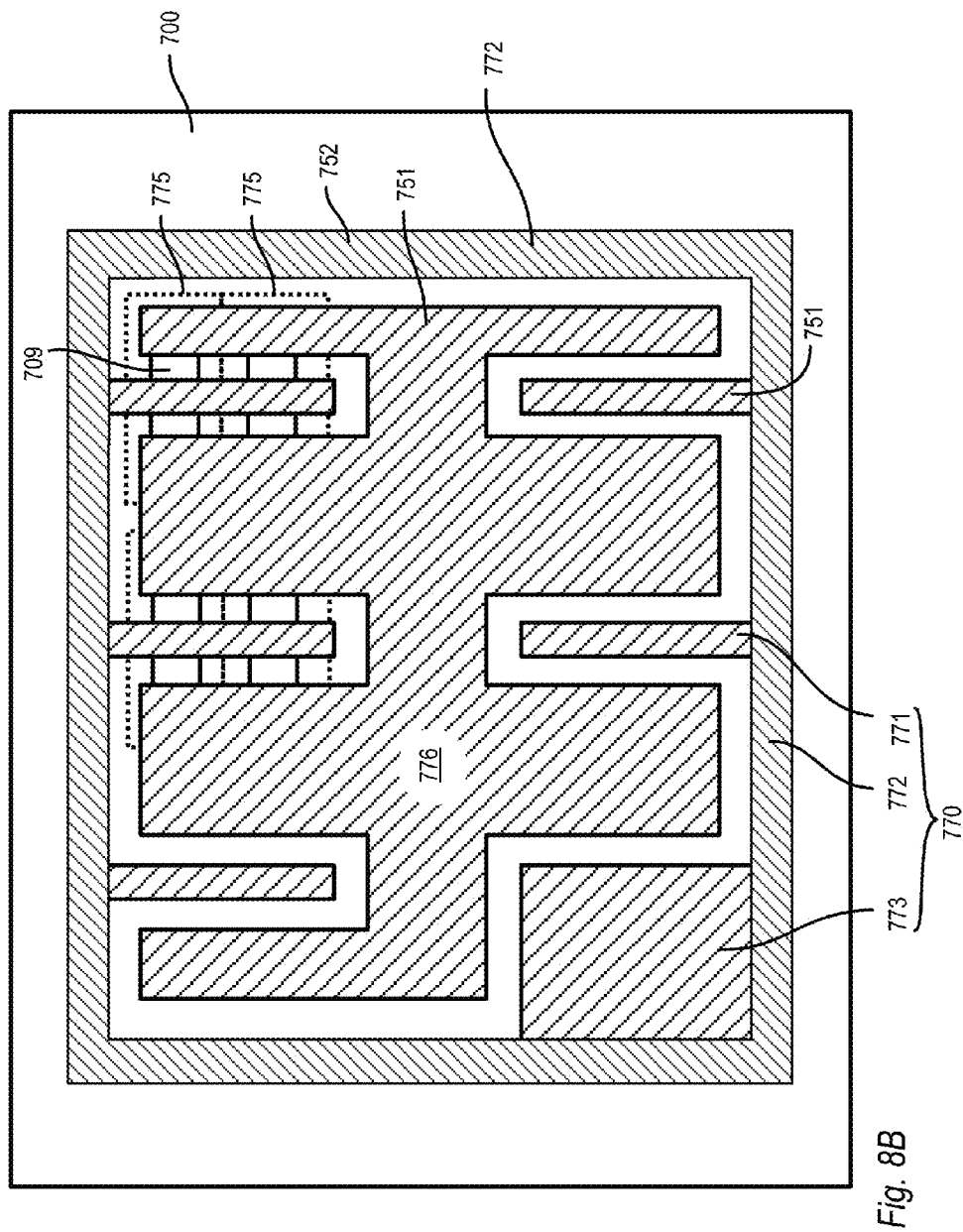
FIG. 8B illustrates a semiconductor device according to an embodiment.

FIG. 8B shows a further embodiment which is similar to the embodiment of FIG. 8A but additionally includes a gate pad 773 which together with the gate fingers 771 and the gate runner 772 forms the gate structure 770. The gate pad 773 is formed, similar to the gate fingers 771, by a portion of the first common metallization structure 751 which includes the first metal layer structure and the second metal layer structure.

Alternatively, the gate fingers 771, similar to the gate runner 772, can also be formed by portions of the second common metallization structure 752 which only includes the first metal layer structure while the gate pad 773 is formed by a portion of the first common metallization structure 751 which includes the first metal layer structure and the second metal layer structure.

In the case of power diodes, the first common metallization structure typically laterally extends completely over the anode region. Metal structures of the edge termination area are typically formed by the second common metallization structure and/or the third common metallization structure as described above to allow formation of fine structures.

In further embodiments, parts of the edge termination area also include the first common metallization structure, i.e. the plated reinforcing layer also partially extends into the edge termination area. For example, a single electrode which is on collector potential or a single or few field plates can be formed by the first common metallization structure at the periphery of the semiconductor device.

In the case of power switches such as IGBTs or MOS-transistors, the reinforcing layer forming part of the first common metallization structure extends at least over all active areas of the respective devices. The metal structures in the edge termination area are typically formed by the second common metallization structure. It is, however, also possible to form parts of the metal structures in the edge termination area by the first common metallization structure, similar to power diodes as described above.

In further embodiments, the gate structure 770 is completely formed by the first common metallization structure, i.e. the gate runner 772 and the gate fingers 771 includes the reinforcing metal layer to reduce the electrical resistance of these structures.

In further embodiments, the gate structure 770 is completely formed by the second common metallization structure, i.e. the gate runner 772 and the gate fingers 771 do not include the reinforcing metal layer. This reduces the risk of delamination during the final packaging processes which applies large loads onto the metal structures. Furthermore, this also allows reducing the space needed for these metal structures.

A mixed structure for the gate structure 770 is also possible and illustrated in FIG. 8.

Typically, the second metal layer structure covers at least 20% of the first metal layer structure in the active area to locally or globally increase the thickness there and to form the first common metallization structure.

In further embodiments, metal structures, which are in electrical contact with the source metallization 776 or with an emitter metallization, can also be formed by any of the above processes. These metal structures, although in electrical contact with, for example, the source metallization 776, are not arranged in the active area and form, for example, a source runner. It is possible to form these and any other metallization structures which are not in the active area by any of the above processes so that these metallization structures can be formed by the first common metallization structure only, by the second common metallization structure only, or by the third common metallization structure only. It is also possible to form these metallization structures in the edge termination area in mixed combination, for example by the first common metallization structure and the second common metallization structure, or by the second common metallization structure and the third common metallization structure.

Figure 9:
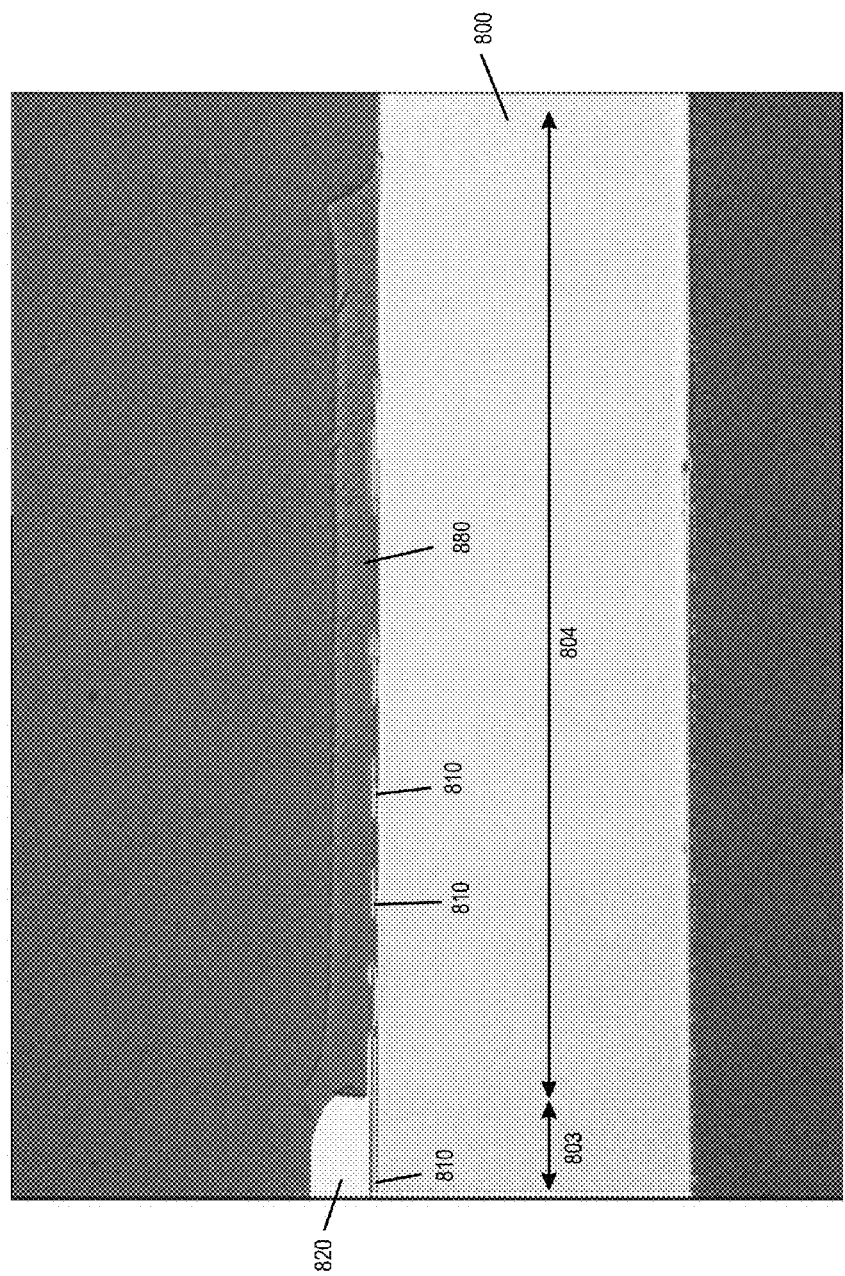
FIG. 9 illustrates a semiconductor device according to an embodiment.

FIG. 9 is a picture of a polished cross-section through a power diode. The first metal layer structure 810 extends in the active area 803 and the edge termination are 804 and forms in the latter one field plates. A second metal layer structure 820 is formed in the active area 803 on the first metal layer structure 810 to locally increase the thickness to form there the first common metallization structure. The field plates are covered by a passivation which can be, for example, an imide passivation.

What is claimed is:

1. A method for manufacturing a semiconductor device, the method comprising:
    providing a semiconductor substrate comprising an active area formed in the semiconductor substrate and an edge termination area formed in the semiconductor substrate and laterally surrounding the active area;
    forming a first metal layer structure on a first side of the semiconductor substrate, wherein the first metal layer structure comprises at least a lower metal layer extending from the active area to the edge termination area and at least an upper metal layer comprising at least a first metal portion in the active area and at least a second metal portion in the edge termination area;
    forming a plating mask on the first metal layer structure to cover the second metal portion while leaving at least a portion of the first metal portion uncovered;
    plating a second metal layer structure at least on and in ohmic contact with the first metal portion, wherein the plating mask covers the second metal portion during plating of the second metal layer structure; and
    etching the lower metal layer of the first metal layer structure using at least the upper metal layer as etching mask after plating the second metal layer structure;
    wherein the second metal layer structure, the first metal portion of the upper metal layer and a portion of the lower metal layer form together a common metallization structure in the active area of the semiconductor device.

2. The method of claim 1, wherein forming the first metal layer structure comprises:
    forming a barrier layer on the first side of the semiconductor substrate and a seed layer on the barrier layer, wherein the barrier layer forms the lower metal layer and the seed layer forms the upper metal layer.

3. The method of claim 2, wherein forming the first metal layer structure further comprises:
    forming an etching mask on the seed layer, the etching mask defining the first metal portion and the second metal portion; and
    etching the seed layer in the presence of the etching mask, wherein the etching stops at the barrier layer.

4. The method of claim 1, further comprising:
    removing the upper metal layer from the lower metal layer after plating the second metal layer structure and after etching the lower metal layer.

5. The method of claim 1, wherein forming the first metal layer structure comprises:
    depositing a barrier layer on the first side of the semiconductor substrate;
    depositing a seed layer on the barrier layer, wherein the barrier layer and the seed layer together form the lower metal layer;
    forming a mask on the seed layer, the mask comprising respective openings defining the size and locations of metal portions of a first metal layer; and
    plating a metal in the openings of the mask to form the first metal layer on and in ohmic contact with the seed layer, wherein the first metal layer forms the upper metal layer and comprises metal portions which form the first and second metal portions of the upper metal layer.

6. The method of claim 5, wherein etching the lower metal layer comprises etching the barrier layer and the seed layer using the first metal layer as etching mask, wherein the method further comprises removing the first metal layer and the seed layer from the barrier layer after plating the second metal layer structure and after etching the barrier layer and the seed layer.

7. The method of claim 1, wherein forming the lower metal layer comprises:
   depositing a barrier layer on the first side of the semiconductor substrate; and
   wherein forming the upper metal layer comprises:
   depositing a seed layer on the barrier layer;
   forming a mask on the seed layer, the mask comprising respective openings defining the size and locations of metal portions of a first metal layer;
   plating a metal in the openings of the mask to form a first metal layer on and in ohmic contact with the seed layer; and
   etching the seed layer using the metal portions of the first metal layer as etching mask before plating the second metal layer structure, wherein the etching stops at the barrier layer, wherein the seed layer and the first metal layer together form the upper metal layer.

8. The method of claim 7, further comprising:
   removing the seed layer and the metal portions of the first metal layer from the barrier layer after plating the second metal layer structure.

9. The method of claim 1, wherein forming the first metal layer structure comprises:
   depositing a barrier layer on the first side of the semiconductor substrate;
   depositing an intermediate metal layer on the barrier layer, wherein the barrier layer and the intermediate metal layer together form the lower metal layer;
   depositing a first metal layer on the intermediate metal layer, wherein the first metal layer forms the upper metal layer;
   forming a mask on the first metal layer; and
   etching the first metal layer using the mask as etching mask to form the first metal portion and the second metal portion of the upper metal layer, wherein the etching stops at the intermediate metal layer or the barrier layer.

10. The method of claim 9, further comprising:
    removing the first metal layer from the intermediate metal layer after plating the second metal layer structure.

11. The method of claim 9, further comprising:
    removing the intermediate metal layer and the first metal layer from the barrier layer after plating the second metal layer structure.

12. The method of claim 9, wherein forming the plating mask on the first metal layer structure comprises:
    forming a plating mask having at least an opening defining the size and location of a first portion of the second metal layer structure above the first metal layer and a further opening defining the size and location of a second portion of the second metal layer structure above the intermediate metal layer; and
    wherein plating the second metal layer structure comprises:
    plating a metal into the opening and the further opening of the plating mask to form the first portion and the second portion of the second metal layer structure.

13. The method of claim 12, further comprising:
    removing the plating mask; and
    etching the intermediate metal layer and the barrier layer using the second metal layer structure and the first metal layer as etching mask;
    wherein the first portion of the second metal layer structure forms together with the first metal layer, the intermediate metal layer and the barrier layer a first common metallization structure;
    wherein the first metal layer forms together with the intermediate metal layer and the barrier layer a second common metallization structure separate to the first common metallization structure; and
    wherein the second portion of the second metal layer structure forms together with the intermediate metal layer and the barrier layer a third common metallization structure separate to the first and second common metallization structure.

14. A method for manufacturing a semiconductor device, the method comprising:
    providing a semiconductor substrate comprising a first area formed in the semiconductor substrate and a second area formed in the semiconductor substrate;
    forming a lower metal layer on a first side of the semiconductor substrate, the lower metal layer extending from the first area to the second area;
    forming at least an upper metal layer comprising at least a first metal portion on and in ohmic contact with the lower metal layer in the first area and at least a second metal portion on and in ohmic contact with the lower metal layer in the second area;
    forming a plating mask to cover at least the second metal portion of the upper metal layer in the second area;
    plating a metal layer structure at least on and in ohmic contact with the first metal portion of the upper metal layer, wherein the plating mask covers the second metal portion of the upper metal layer during plating of the metal layer structure; and
    etching the lower metal layer using the upper metal layer as etching mask after plating the second metal layer structure.

* * * * *